US011552501B2

United States Patent
Sloop et al.

(10) Patent No.: US 11,552,501 B2
(45) Date of Patent: Jan. 10, 2023

(54) METHODS AND SYSTEMS FOR DETECTION AND NOTIFICATION OF POWER OUTAGES AND POWER QUALITY

(71) Applicant: Whisker Labs, Inc., Germantown, MD (US)

(72) Inventors: Christopher Dale Sloop, Mount Airy, MD (US); Robert S. Marshall, Ijamsville, MD (US); Donnie Bixler, Woodsboro, MD (US); Chonglin Liu, Rockville, MD (US)

(73) Assignee: Whisker Labs, Inc., Germantown, MD (US)

( * ) Notice: Subject to any disclaimer, the term of this patent is extended or adjusted under 35 U.S.C. 154(b) by 127 days.

(21) Appl. No.: 17/200,241

(22) Filed: Mar. 12, 2021

(65) Prior Publication Data

US 2021/0288521 A1 Sep. 16, 2021

Related U.S. Application Data

(60) Provisional application No. 62/989,415, filed on Mar. 13, 2020.

(51) Int. Cl.
*H02J 13/00* (2006.01)
*G06Q 50/06* (2012.01)
*G01R 22/06* (2006.01)

(52) U.S. Cl.
CPC ...... *H02J 13/00002* (2020.01); *G01R 22/068* (2013.01); *G06Q 50/06* (2013.01); *H02J 13/00034* (2020.01)

(58) Field of Classification Search
CPC .......... H02J 13/00002; H02J 13/00034; H02J 3/0012; G01R 22/068; G01R 19/2513;

(Continued)

(56) References Cited

U.S. PATENT DOCUMENTS 7,492,163 B2   2/2009 Restrepo et al.
7,804,280 B2 *  9/2010 Deaver, Sr. .......... H02J 3/1828
                                             323/210

(Continued)

FOREIGN PATENT DOCUMENTS

EP      2016657 B1     1/2009

OTHER PUBLICATIONS

Invitation to Pay Additional Fees and Annex to Form PCT/ISA/206 in related International Patent Application No. PCT/JS2021/022176, dated Jul. 15, 2021, 10 pages.

*Primary Examiner* — Ramesh B Patel
(74) *Attorney, Agent, or Firm* — Cesari & McKenna, LLP

(57) ABSTRACT

Described herein are methods and systems for detection and notification of electrical power outages and power quality. A sensor coupled to a circuit transmits a keepalive packet to a server. The sensor detects an input signal generated by electrical activity. The sensor generates an output signal based upon the input signal. The sensor monitors the output signal. During a clock cycle, the sensor determines whether a rising edge occurred and transmits a fault packet to the server when the rising edge occurred prior to a predetermined clock value or when no rising edge occurred. The server receives the fault packet from the sensor and listens for keepalive packets. The server transmits a power outage notification when no keepalive packets are received for at least a defined time period after the fault packet is received. The server transmits a power restoration notification when one or more keepalive packets are subsequently received.

44 Claims, 35 Drawing Sheets

(58) Field of Classification Search
CPC ......... G06Q 50/06; Y02E 60/00; Y04S 10/30; Y04S 10/52
See application file for complete search history.

(56) References Cited

U.S. PATENT DOCUMENTS

| | | | | |
|---|---|---|---|---|
| 8,385,038 | B2* | 2/2013 | Saito | H01H 33/593 361/96 |
| 9,739,813 | B2* | 8/2017 | Houlette | G01R 21/133 |
| 10,018,701 | B2* | 7/2018 | Marshall | G01R 22/065 |
| 10,354,345 | B2* | 7/2019 | Sloop | G05B 15/02 |
| 10,809,286 | B2* | 10/2020 | Micali | G05B 15/02 |
| 11,146,103 | B1* | 10/2021 | Davies | H02J 3/383 |
| 11,338,107 | B2* | 5/2022 | Allen | H04L 12/2829 |
| 2004/0061616 | A1* | 4/2004 | Fischer | H02J 13/00016 340/657 |
| 2009/0184835 | A1* | 7/2009 | Deaver, Sr. | H02J 13/00009 340/660 |
| 2009/0187285 | A1* | 7/2009 | Yaney | H02J 13/00028 700/292 |
| 2009/0187358 | A1* | 7/2009 | Deaver, Sr. | G01R 31/52 702/58 |
| 2010/0007354 | A1* | 1/2010 | Deaver, Sr. | G01R 31/52 324/539 |
| 2010/0191487 | A1* | 7/2010 | Rada | H02J 3/01 707/E17.014 |
| 2013/0241746 | A1* | 9/2013 | McKinley | G01R 29/18 340/870.02 |
| 2014/0340236 | A1* | 11/2014 | Rhoads | G06Q 50/06 340/870.02 |
| 2015/0276825 | A1* | 10/2015 | Curt | G01R 19/2513 702/58 |
| 2018/0024205 | A1* | 1/2018 | Kim | H02J 13/00034 700/293 |
| 2019/0251641 | A1* | 8/2019 | Kagan | G06Q 50/06 |
| 2020/0379947 | A1* | 12/2020 | Kagan | G01D 4/004 |
| 2021/0080514 | A1* | 3/2021 | Beaudet | G01R 19/2513 |

* cited by examiner

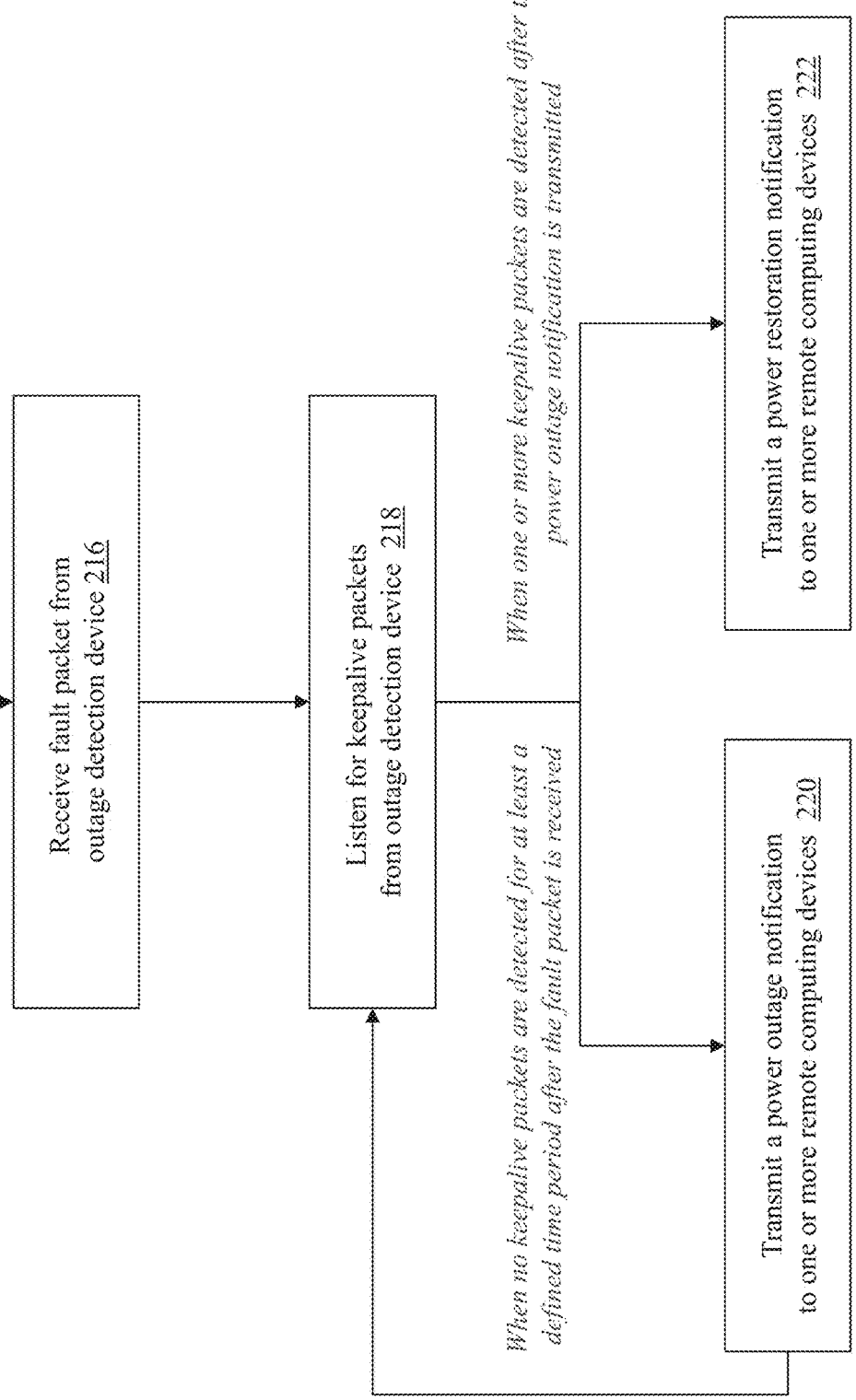

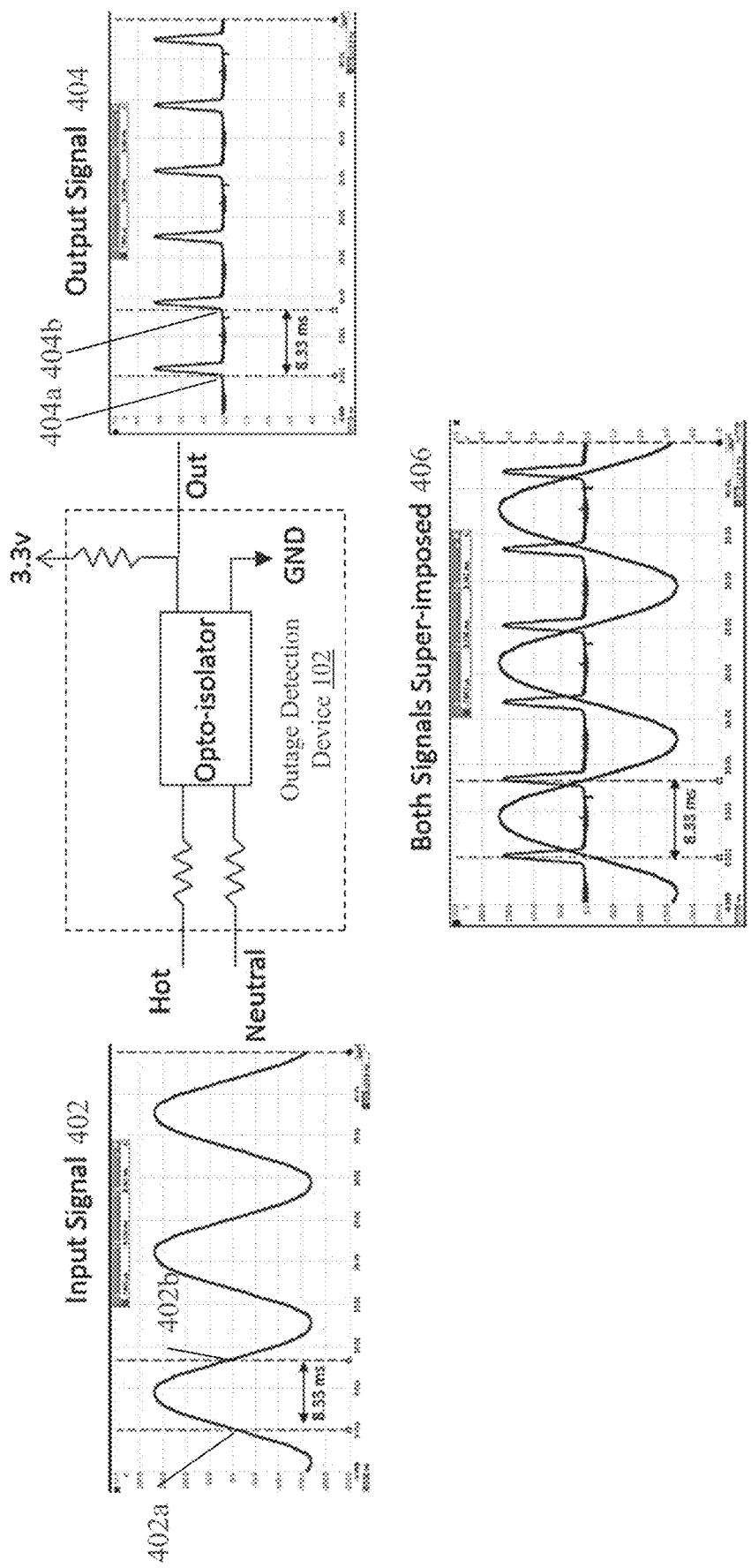

EXAMPLE OF SWELL JUMP EVENT

EXAMPLE OF GRID FREQUENCY EVENT

*EXAMPLE OF NOMINAL VOLTAGE READINGS*

EXAMPLE OF LOOSE NEUTRAL – many large positive jumps of voltage

EXAMPLE OF LOOSE NEUTRAL BEFORE & AFTER RESOLUTION

FIG. 19

METHODS AND SYSTEMS FOR DETECTION AND NOTIFICATION OF POWER OUTAGES AND POWER QUALITY

RELATED APPLICATIONS

This application claims priority to U.S. Provisional Patent Application No. 62/989,415, filed on Mar. 13, 2020, the entirety of which is incorporated herein by reference.

TECHNICAL FIELD

The subject matter of the application relates generally to methods and systems for detection and notification of power outages and power quality in electrical systems.

BACKGROUND

Consumers continue to rely more heavily on the availability of uninterrupted electricity for a wide variety of activities, such as powering communications devices, computing devices, medical devices, heating and cooling appliances, refrigeration, and the like. However, according to the U.S. Energy Information Administration (EIA), the average U.S. electricity customer was without power for 250 minutes and experienced 1.3 outages of power in 2016. The amount of time a customer was without power nearly doubled in 2017 to an average of 470 minutes (7.8 hours) with an average of 1.4 outages. In 2016 the longest outages were on the order of 20 hours, while in 2017 that number increased to a little higher than 40 hours. Often, these outages are unplanned and in some cases, can go undetected by, e.g., a homeowner who is away from home. These outages can have a significant impact on almost every aspect of daily life—including health and safety—so immediate detection and notification of outages is very important.

Currently available technology for detecting power outages typically relies on the use of a backup battery and/or a generator that can temporarily provide electricity to a power outage detection device and supporting communication equipment. However, batteries have a limited lifetime and add cost to the outage detection device. Replacement of batteries creates an ongoing maintenance burden for the user. In addition, in some cases, activation of a battery backup could result in an undesirable delay between when the outage begins and when the backup electricity supply is activated and able to provide power to the detection device.

Additionally, electrical generation, transmission and distribution systems are getting more complex. The transition to energy sources that produce less carbon dioxide ($CO_2$) means there will be a combination of many different generation methods including wind, solar, nuclear, battery, natural gas and coal. Homes and businesses will increasingly have on-premises methods of generating energy and all of these generation systems are superimposed on an electrical grid with various levels of aging and exposure to the environment. Switching between various generation types can cause surges and sags in voltage, and other power quality concerns. Aging and environmental exposure causes transformers and electrical inter-connections to deteriorate and fail. Surges, sags and deteriorating equipment can cause home electronics and appliances to fail as well as create very dangerous situations where electrocution and electrical fires can occur. In a residential setting, fires often begin in walls or other hidden cavities and gain significant heat and headway before they are detected by home occupants or smoke detectors, leading to significant damage. Electrical malfunctions are one of the leading causes of residential home fires. Because of the hidden nature of the ignition source, electrical fires are also a disproportionate cause of death. Electrical fires are estimated to cause 420 deaths, 1,370 injuries, and $1.4B in residential damages annually.

Current technology does not provide a homeowner with much needed information about the quality of power they receive from the utility. For example, a homeowner may be aware of lights flickering or frequent loss of sensitive electronics equipment without being alerted to very serious issues in the electrical connection to their home or within the home's electrical network. Furthermore, damage to and deterioration of the United States electric grid is increasing risk and liability for the grid's utility owners and their customers. For example, a recent Pacific Gas & Energy (PG&E) Fire Incident Data Report shows that PG&E experienced over 2,400 grid-caused fires from 2014 through 2019. These fires resulted in excess of $13B in liability and precipitated PG&E's filing for bankruptcy. In another example, a Texas Wildfire Mitigation Project study found that 4,000 fires, most local and of little consequence, but also larger conflagrations, were caused by utility transmission or distribution system events taking place in a period of less than four years preceding that study. In addition to wildfires, increases in transformer fires and explosions and other catastrophic grid events are linked to deteriorating utility equipment. In one horrific example, in mid-July of 2019 firefighters were called to downtown Madison, Wis., where a high-voltage transformer had exploded and caught fire. Another recent event was the American Electric Power (AEP) Texas substation transformer explosion and fire at the end of July 2019. Finally, in February 2021, the state of Texas experienced a devastating failure of its power grid due to a severe winter storm, resulting in loss of life and millions of people without electricity in below-freezing temperatures.

As noted above, utility grid-caused fires have resulted in very large economic damage, and often significant mortality, every year. Many power system components (e.g., switches, insulators, transformers) provide trouble-free service for decades, but transmission and distribution components eventually fail. Wildfires and other damage to property and life can be triggered via a number of mechanisms including: downed lines, vegetation contact, conductor slap, arcing of damaged or deteriorating equipment, repetitive faults, and apparatus failures. Therefore, rapid detection and mitigation of these issues is crucial to preventing catastrophic fire events.

SUMMARY

Therefore, what is needed is are methods and systems for detecting power outages and power quality in electrical systems in real time or near real time, and for notifying relevant users (including electrical grid operators and/or governmental officials) of the outages and/or undesirable changes in power quality or hazardous conditions in the electrical system. The techniques described herein advantageously provide for the detection of power outages, evaluation of power quality, and identification of electrical system hazards based upon detected frequency of alternating current (AC) electricity received by an outage detection device, and also provide for immediate notification of the power outages to remote devices—including in some embodiments, using communication equipment that is powered by the electrical system that experiences the outage right before the communication equipment goes offline due to the outage. Also, in some embodiments, the methods and systems described herein leverage a single monitoring device, or a few monitoring devices, that plug into an existing electrical outlet—instead of complicated, expensive, or dangerous installation of other power outage detection devices and/or monitoring components (such as connecting to circuit breakers or electrical panels). The technology described herein not only beneficially provides homeowners and business owners insight into power quality and potential for hazards, but with multiple homes using the methods and systems described herein, the technology provides insight to utilities about any issues and give them the ability to be proactive to fix issues before a hazard becomes dangerous.

The invention, in one aspect, features a system for detection and notification of electrical power outages. The system comprises a sensor device coupled to a circuit and a server computing device. The sensor device periodically transmits a keepalive packet to the server computing device. The sensor device detects an input signal generated by electrical activity on the circuit. The sensor device generates an output signal based upon the detected input signal. The sensor device monitors the generated output signal during each of a plurality of clock cycles having a predefined duration. During each clock cycle, the sensor device determines whether a rising edge occurred in the generated output signal and transmits a fault packet to the server computing device when the rising edge occurred prior to a predetermined clock value in the clock cycle or when no rising edge occurred in the clock cycle. The sensor device initiates a new clock cycle. The server computing device receives the fault packet from the sensor device. The server computing device listens for one or more keepalive packets from the sensor device. The server computing device transmits a power outage notification to one or more remote computing devices when no keepalive packets are received from the sensor device for at least a defined time period after the fault packet is received. The server computing device transmits a power restoration notification to the one or more remote computing devices when one or more keepalive packets are subsequently received from the sensor device after the power outage notification is transmitted.

The invention, in another aspect, features a computerized method of detection and notification of electrical power outages. A sensor device coupled to a circuit periodically transmits a keepalive packet to a server computing device. The sensor device detects an input signal generated by electrical activity on the circuit. The sensor device generates an output signal based upon the detected input signal. The sensor device monitors the generated output signal during each of a plurality of clock cycles having a predefined duration. During each clock cycle, the sensor device determines whether a rising edge occurred in the generated output signal and transmits a fault packet to the server computing device when the rising edge occurred prior to a predetermined clock value in the clock cycle or when no rising edge occurred in the clock cycle. The sensor device initiates a new clock cycle. The server computing device receives the fault packet from the sensor device. The server computing device listens for one or more keepalive packets from the sensor device. The server computing device transmits a power outage notification to one or more remote computing devices when no keepalive packets are received from the sensor device for at least a defined time period after the fault packet is received. The server computing device transmits a power restoration notification to the one or more remote computing devices when one or more keepalive packets are subsequently received from the sensor device after the power outage notification is transmitted.

Any of the above aspects can include one or more of the following features. In some embodiments, the input signal comprises an alternating current (AC) voltage sine wave with a plurality of zero crossings. In some embodiments, the output signal is a voltage curve having a plurality of rising edges corresponding to the zero crossings of the input signal. In some embodiments, the keepalive packet comprises power quality data including one or more of: root mean square (RMS) voltage, frequency of the voltage sine wave, relative phase angle of the voltage sine wave, amplitude of the voltage sine wave harmonics, or any number of measures of high frequency noise amplitude. In some embodiments, each clock cycle has a predefined duration of 9 milliseconds. In some embodiments, the predetermined clock value in the clock cycle is 8.33 milliseconds.

The invention, in another aspect, features a system for detection and notification of electrical power quality. The system comprises one or more sensor devices coupled to a circuit and a server computing device. The one or more sensor devices detect an input signal generated by electrical activity on the circuit. The one or more sensor devices generate an output signal based upon the detected input signal. The one or more sensor devices transmit power quality data to the server computing device, the power quality data based upon the output signal. The server computing device receives the power quality data from the one or more sensor devices. The server computing device analyzes the power quality data in conjunction with historical power quality data received from the one or more sensor devices to detect one or more power quality events. The server computing device transmits a power quality notification to one or more remote computing devices based upon the detected power quality events.

The invention, in another aspect, features a computerized method of detection and notification of electrical power quality. A sensor device coupled to a circuit detects an input signal generated by electrical activity on the circuit. The sensor device generates an output signal based upon the detected input signal. The sensor device transmits power quality data to a server computing device, the power quality data based upon the output signal. The server computing device receives the power quality data from the sensor device. The server computing device analyzes the power quality data in conjunction with historical power quality data received from the sensor device to detect one or more power quality events. The server computing device transmits a power quality notification to one or more remote computing devices based upon the detected power quality events.

Any of the above aspects can include one or more of the following features. In some embodiments, the detected one or more power quality events comprise one or more of: surge events, surge jump events, sag events, sag jump events, brownout events, swell jump events, high frequency (HF) filter jump events, frequency jump events, recurring power quality problems, phase angle jump events, loose neutral events, or generator activation events. In some embodiments, the server computing device further correlates (i) the detected one or more power quality events with zero or more external events and/or (ii) a detected power quality event from a first sensor device with a detected power quality event from one or more other sensor devices.

In some embodiments, the server computing device detects a loose neutral event by: analyzing, for a single sensor device, a number and amplitude of surge events, surge jump events, and sag events recorded by the single sensor device within a predetermined time period which do not correlate with matching power quality events from any other sensor devices in proximity to the single sensor device; and generating a loose neutral event when an average number of the surge events is greater than a first defined number per day, or an average number of the surge jump events having a magnitude greater than a defined percentage of a nominal voltage is greater than a second defined number per day, or an average number of the sag events is greater than a third defined number per day.

In some embodiments, the output signal comprises one or more of: root mean square (RMS) voltage, frequency of the voltage sine wave, relative phase angle of the voltage sine wave, amplitude of the voltage sine wave harmonics, or any number of measures of high frequency noise amplitude. In some embodiments, the server computing device detects a surge event by: analyzing a plurality of sequential data points of RMS voltage from one or more sensor devices; and generating a surge event when the RMS voltage is greater than a predefined threshold percentage of a nominal voltage for a number of consecutive data points. In some embodiments, the predefined threshold percentage varies based upon the number of consecutive data points in which the RMS voltage is greater than a minimum threshold percentage.

In some embodiments, the server computing device detects a brownout event by: analyzing a plurality of sequential data points of RMS voltage from one or more sensor devices; and generating a brownout event when the RMS voltage is less than a predefined threshold percentage of a nominal voltage for a number of consecutive data points. In some embodiments, the predefined threshold percentage varies based upon the number of consecutive data points in which the RMS voltage is less than a minimum threshold percentage.

In some embodiments, the server computing device detects a sag jump event by: analyzing a plurality of sequential data points of RMS voltage from one or more sensor devices; and generating a sag jump event for each of one or more drops of RMS voltage that occurred in the plurality of sequential data points and that are larger than a predefined threshold percentage of a nominal voltage.

In some embodiments, the server computing device detects a swell jump event by: analyzing a plurality of sequential data points of RMS voltage from one or more sensor devices; and generating a swell jump event for each of one or more increases of RMS voltage that occurred in the plurality of sequential data points and that are larger than a predefined threshold percentage of a nominal voltage.

In some embodiments, the server computing device detects a HF Filter jump event by: analyzing a plurality of sequential data points of HF amplitude data from one or more sensor devices; calculating a mean of the HF amplitude data; and when the mean is greater than one, generating an HF Filter jump event when the HF amplitude data increases by more than a threshold multiple of the mean, or when the mean is less than one, generating an HF Filter jump event when the HF amplitude data increases above a predefined threshold.

In some embodiments, the server computing device detects a frequency jump event by: analyzing a plurality of sequential data points of frequency data from one or more sensor devices; calculating an average of the frequency data; calculating a standard deviation of the frequency data; and generating a frequency jump event when the frequency increases by more than a predefined threshold from the average, or generating a frequency jump event when (i) the standard deviation changes from less than a first frequency to greater than a second frequency or (ii) the standard deviation changes from greater than the second frequency to less than the first frequency.

In some embodiments, the server computing device detects a generator activation event by: analyzing, for a single sensor device, whether any power outage events and frequency events were detected by the single sensor device during a predetermined time period; and generating a generator activation event when the single sensor device detected a power outage event followed by a frequency standard deviation change to greater than a predefined threshold within a defined period of time of the power outage event and the frequency standard deviation change was not associated with a correlated external event.

In some embodiments, the one or more external events comprise lightning activity events, electrical grid monitoring events, and energy pricing events. In some embodiments, the detected power quality event from the first sensor device and the detected power quality event from one or more other sensor devices are of a same event type. Such power quality events that have the same event type (including but not limited to the same or similar power quality characteristics, durations, start times, stop times, geographic locations, and the like) are referred to herein as "correlated events" or "matching events."

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

FIGS. 2A and 2B comprise a flow diagram of a computerized method of detection and notification of electrical power outages.

FIG. 4 is a diagram of an exemplary input signal received by the outage detection device and an exemplary output signal generated by the outage detection device.

FIG. 19 is a diagram of a user interface displayed on a remote computing device that shows a month's worth of power quality events detected by an outage detection device.

DETAILED DESCRIPTION

Figure 1:
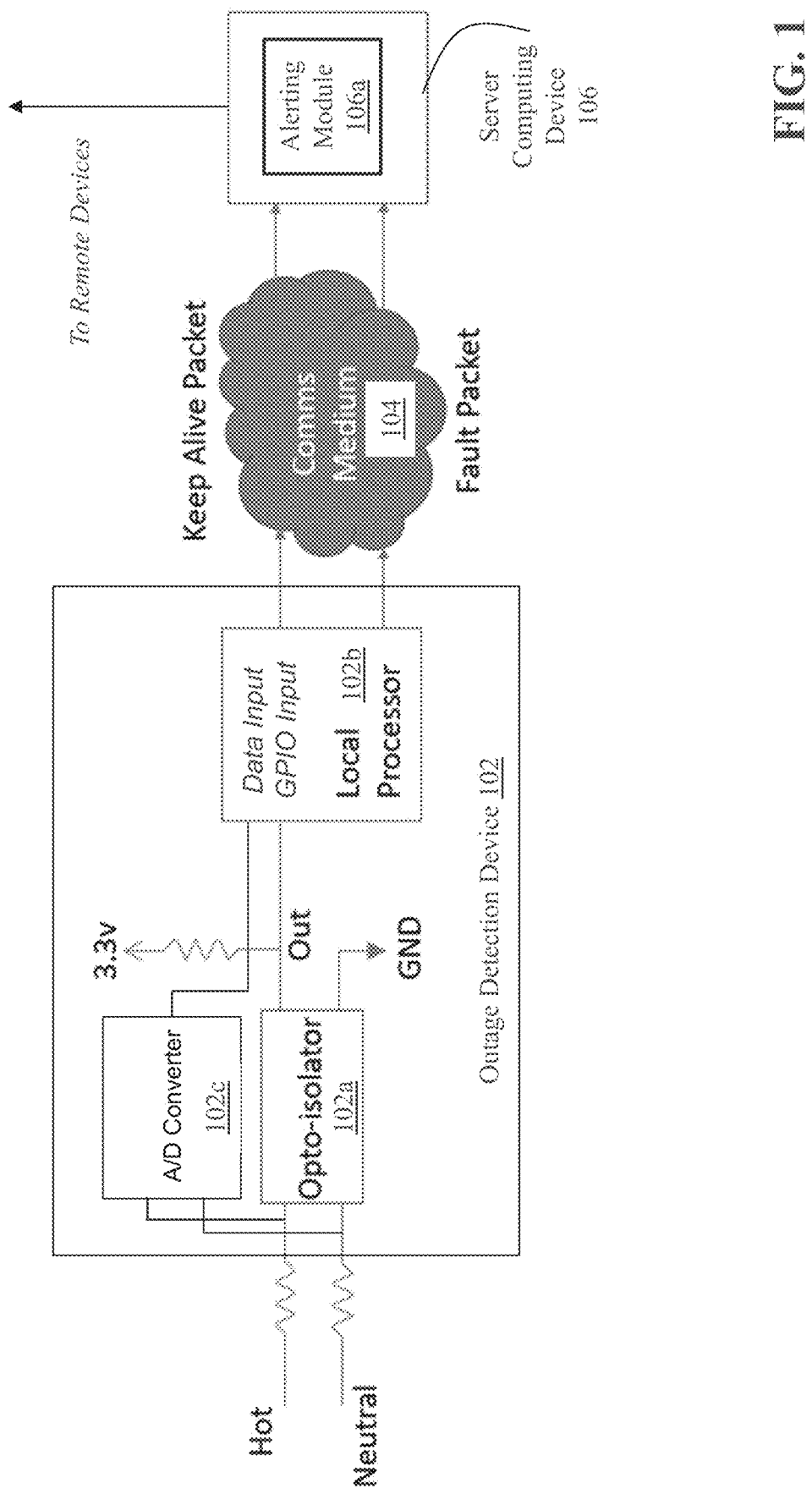
FIG. 1 is a block diagram of a system for detection and notification of electrical power outages.
Figure 3:
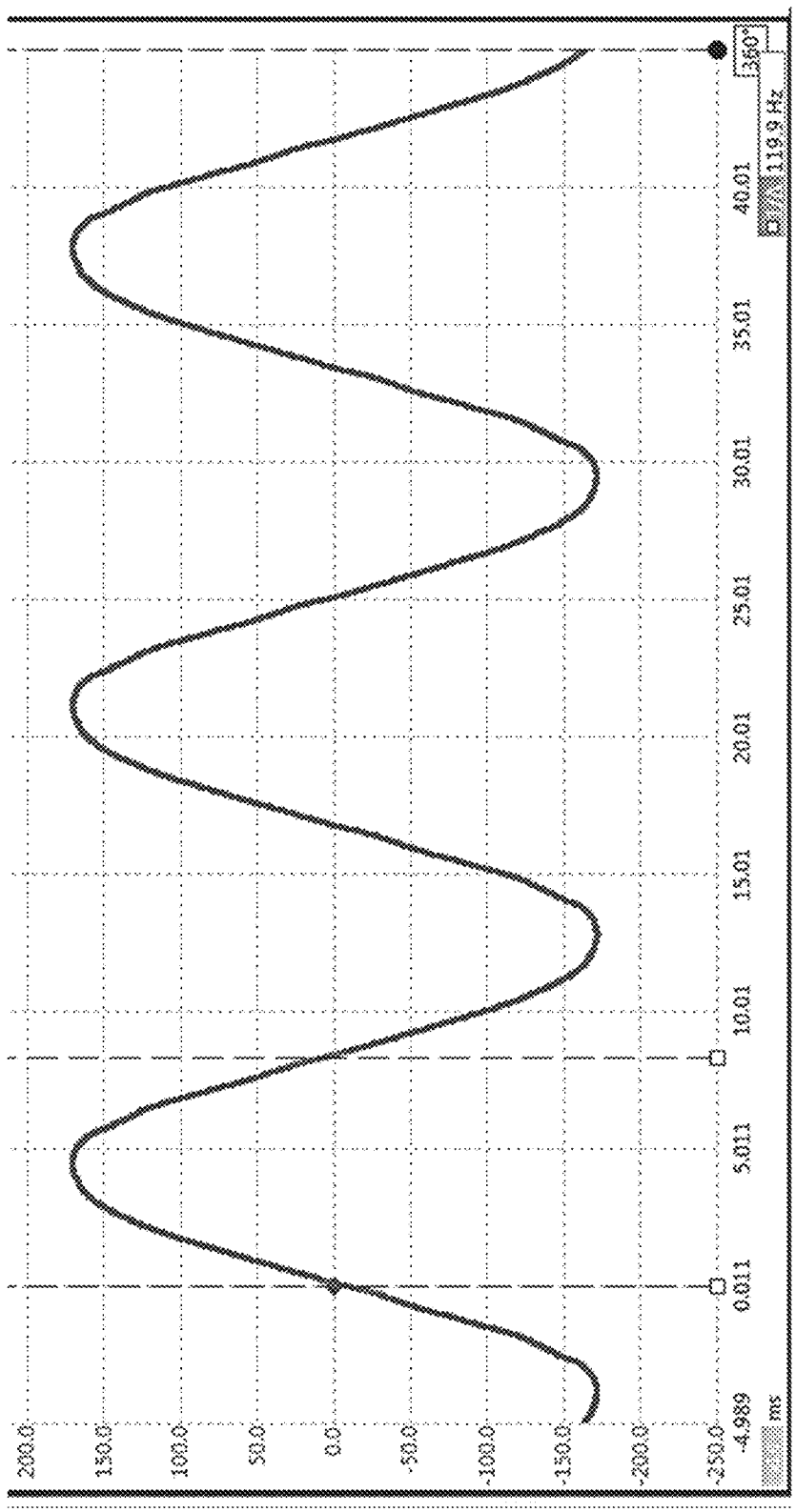
FIG. 3 is a diagram of an exemplary 60 Hz voltage signal captured by the outage detection device.

FIG. 1 is a block diagram of a system 100 for detection and notification of electrical power outages. The system 100 includes an outage detection device 102, a communications medium 104, and a remote computing device 106. The outage detection device 102 comprises an opto-isolator 102*a* that connects to the hot wire and neutral wire of the electrical power system in order to monitor electrical current (e.g., 120 VAC, 60 Hz) for the purposes described herein. The opto-isolator 102*a* is also connected to a ground (GND). An exemplary 60 Hz voltage signal captured by the outage detection device is shown in FIG. 3. The opto-isolator 102*a* generates an output signal (Out) based upon the received electrical current that is provided to a processor 102*b* of the outage detection device 102. The processor 102*b* analyzes the output signal from the opto-isolator 102*a* and transmits data (e.g., packet-based communication) to a server computing device 106 which, based upon the data received from the outage detection device 102, can transmit outage notifications to one or more remote computing devices (not shown). An exemplary power outage detection device 102 is the Ting™ Sensor available from Whisker Labs, Inc. of Germantown, Md.

The outage detection device 102 also contains an Analog-to-Digital (A/D) converter 102*c* which reads input signals from the hot wire and neutral wire. In some embodiments, the input signals may be filtered or transformed prior to the signals being read by the A/D converter 102*c*. The A/D converter 102*c* generates certain power quality data to transmit to the server, including but not limited to RMS Voltage, Peak Voltage, Frequency, Phase, High Frequency (HF) amplitude and amplitudes of harmonics. It can be appreciated that other power quality measures can be calculated and this list is not meant to be exhaustive. Power quality data is transmitted regularly to the server computing device at a regular time interval and is included as part of the "keep alive packet" shown in FIG. 1 and described herein.

The communications medium 104 enables the other components of the system 100 to communicate with each other in order to perform the process of detection and notification of electrical power outages as described herein. The medium 104 may be a local network, such as a LAN including one or more components (e.g., routers, modems) connected to the electrical wiring that is being monitored by the system 100, or a wide area network, such as the Internet and/or a cellular network. In some embodiments, the network 104 is comprised of several discrete networks and/or sub-networks (e.g., cellular to Internet) that enable the components of the system 100 to communicate with each other. The communications medium 104 can comprise wired and/or wireless components.

The server computing device 106 is a combination of hardware, including one or more special-purpose processors and one or more physical memory modules, and specialized software modules that are executed by a processor of the server computing device 106, to receive data from other components of the system 100, transmit data to other components of the system 100, and perform functions for detection and notification of electrical power outages as described herein. In some embodiments, the server computing device 106 comprises an alerting module 106a, which is a specialized set of computer software instructions programmed onto a dedicated processor in the server computing device 106 and can include specifically-designated memory locations and/or registers for executing the specialized computer software instructions. Further explanation of the specific processing performed by the alerting module 106a will be provided below.

As can be appreciated, in some cases it is beneficial to correlate other outside events (e.g., events that are external to the power grid/power system) with power quality events. For example, if a lightning strike is closely correlated with a surge power quality event, then the system 100 can issue a more urgent notification warning to the end user (e.g., a visual and audible alert message on multiple end user devices), especially if the amplitude of the surge event is at an amplitude which could cause significant damage to appliances in the home. A homeowner may be extra vigilant to monitor immediate hazards in the home if he or she knows that a very strong surge was caused by a direct hit of a lightning strike. It may also be beneficial to correlate power quality events with other grid monitoring devices such as an automatic circuit recloser device. In this way, a utility could utilize the technology described herein to correlate events from the recloser device to power quality events in a home or business. External events can be correlated with power quality events to limit the distribution or to elevate the criticality of the notification to the end users.

In some embodiments, the outage detection device 102 is coupled via a 120 VAC plug to an electrical outlet of a branch circuit in a building electrical system, which in turn is connected to a utility power grid. Although FIG. 1 depicts a single outage detection device 102, it should be appreciated that the system 100 can comprise two or more outage detection devices positioned to sense electrical activity in a power distribution system. Multiple sensors sending data to a server computing device can provide increased sensitivity and work together to provide information on the power outages and power quality of the electrical system and/or power grid. It should be further appreciated that a single location (e.g., a home) may have multiple outage detection devices installed, and also that the system 100 can be configured to receive data from a plurality of outage detection devices each installed in a different location (as described below with respect to FIG. 9).

As noted above, the outage detection device 102 is communicably coupled to server computing device 106 via a communication medium 104. In one embodiment, the outage detection device 102 is equipped with communication components (e.g., antenna, network interface circuitry) that enable the outage detection device 102 to communicate with the server computing device 106 via a wireless connection (i.e., using wireless components such as routers and/or modems of the communication medium 104).

Figure 2A:
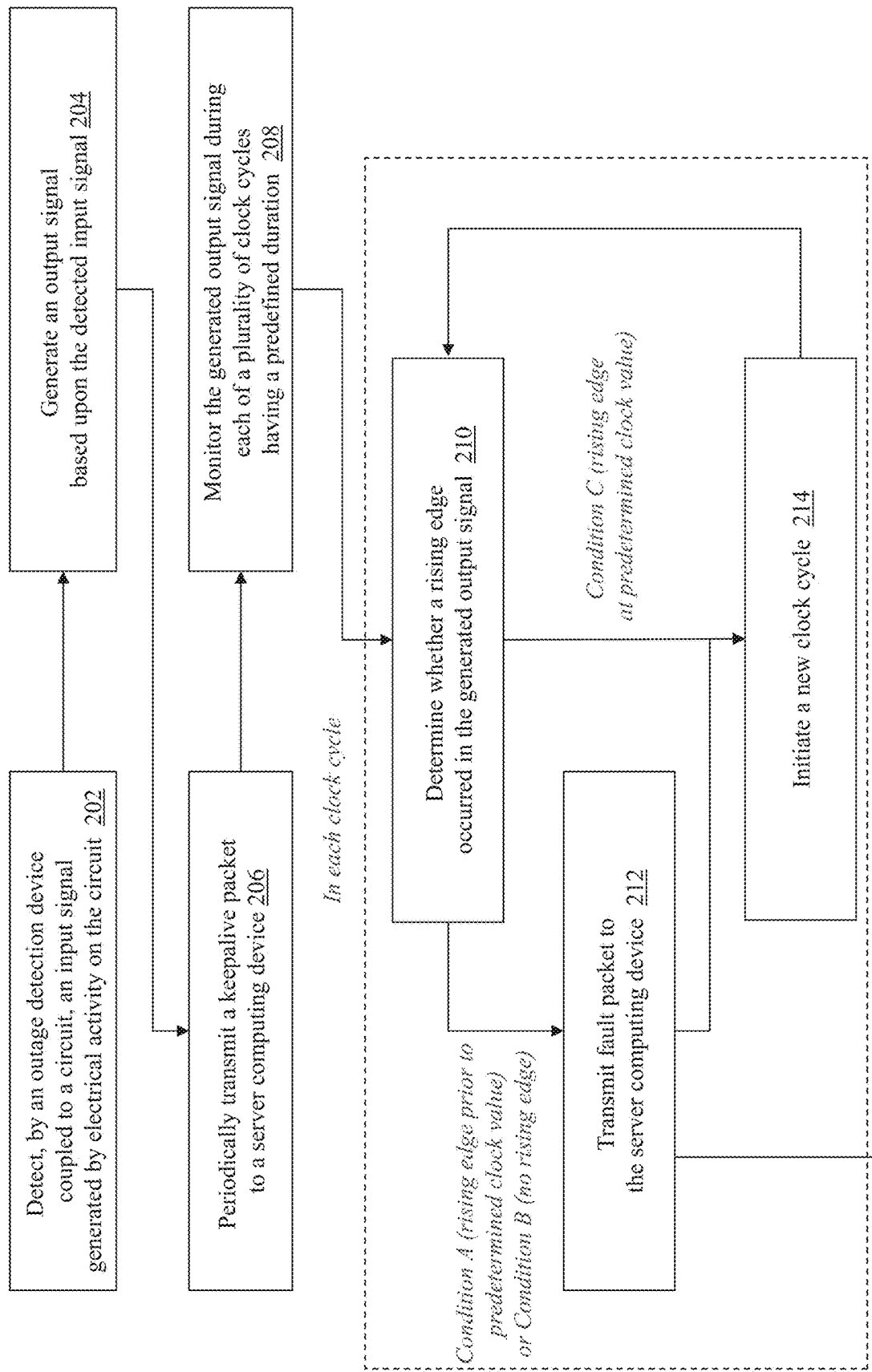

FIGS. 2A and 2B comprise a flow diagram of a computerized method 200 of detection and notification of electrical power outages, using the system 100 of FIG. 1. An outage detection device (e.g., outage detection device 102), coupled to a branch circuit of a power distribution system, detects (202) an input signal generated by electrical activity on the branch circuit. The outage detection device 102 generates (204) an output signal based upon the detected input signal. FIG. 4 is a diagram of an exemplary input signal 402 received by the outage detection device 102 and an exemplary output signal 404 generated by the outage detection device 102. As shown in FIG. 4, the input signal 402 comprises a typical alternating current (AC) voltage signal (such as an AC sine wave) with zero crossings (e.g., 402a, 402b) occurring approximately 8.33 milliseconds (ms) apart.

The opto-isolator 102a of outage detection device 102 receives the input signal 402 via the hot and neutral connections to the power distribution system (including the electrical grid) and converts the input signal 402 into the output signal 404. As shown in FIG. 4, the output signal 404 comprises a voltage curve having a plurality of rising edges (e.g., 404a, 404b) that generally correspond to the zero crossings of the input signal 402, in that the rising edges occur approximately 8.33 ms apart. The diagram 406 in FIG. 4 depicts the input signal 402 and the output signal 404 superimposed, to show the correspondence of the signals. It should be appreciated that, depending upon the electrical system to which the outage detection device 102 is coupled (including the spectrum of electronic devices that may be coupled to the electrical system), one or more different points on the plurality of rising edges in the output signal 404 can correspond to the zero crossings of the input signal 402—for example, the start of the rising edges in the output signal 404 can correspond to the zero crossings of the input signal 402, the midpoint between start and peak of the rising edges can correspond to the zero crossings, or the peak of the rising edges can correspond to the zero crossings. It should further be appreciated that the same points on each rising edge (e.g., start, midpoint, and peak) should occur approximately 8.33 ms apart. The output signal 404 is transmitted to the processor embedded in the outage detection device (see FIG. 1), which monitors the output signal 404 as described below. It should be appreciated that the exact timing of the zero crossings described herein is for example purposes only, and corresponds to standard timing of U.S. power systems. The algorithms and techniques described herein here can be modified to automatically detect and adjust to differing timing of international power systems.

Turning back to FIG. 2A, when the outage detection device 102 is powered up and connected to the server computing device 106, the outage detection device 102 periodically transmits (206) a keepalive packet to the alerting module 106a of server computing device 106. The keepalive packet is used to inform the server computing device 106 that the outage detection device 102 is receiving electrical power (i.e., there is no power outage at the corresponding location) and that the outage detection device 102 is online. For example, the processor 102b of the outage detection device 102 executes a main thread that runs continuously and sends the keepalive packet to the server computing device 106 at a regular ¼ second interval. In some embodiments, the keepalive packet can additionally contain other regularly monitored data that is generated by the A/D converter 102c as described above, such as the measured root mean square (RMS) voltage of the power distribution system, the frequency of the voltage sine wave, the relative phase angle of the sine wave, amplitude of the sine wave harmonics and any number of measures of the high frequency noise amplitude. Examples of certain, non-limiting types of power quality data that can be captured and transmitted by the outage detection device 102 are described in U.S. Pat. No. 10,641,806, titled "Detection of Electric Discharges that Precede Fires in Electrical Wiring," which is incorporated herein by reference.

In addition, the main thread monitors a global power outage flag. When the power outage flag is set (e.g., to 1), the main thread sends a fault packet to the server computing device 106 (e.g., indicating a power outage) and resets the power outage flag to 0. Additional detail about the power outage flag and fault packet is described below.

The outage detection device 102 monitors (208) the generated output signal during each of a plurality of clock cycles having a defined duration. For example, the processor 102b of outage detection device 102 can create a timer (or timeout clock) that cyclically counts down from 9 ms (~55 Hz frequency) to zero, and then resets. When the timer reaches zero, the processor 102b calls an interrupt to the main thread (the "timeout interrupt"). In addition, the processor 102b calls an interrupt to the main thread (the "opto-isolator interrupt") when the processor detects a rising edge in the output signal (i.e., signal 404 in FIG. 4) received from the opto-isolator 102a.

When the processor 102b calls the opto-isolator interrupt, the processor 102b of outage detection device 102 determines (210) whether a rising edge occurred in the generated output signal 404. For example, the processor 102b counts how many clock ticks occurred since the time of the last opto-isolator interrupt. When either (i) a rising edge occurred in the generated output signal 404 prior to a predetermined clock value in the clock cycle (for example, if the last opto-isolator interrupt occurred less than 7.6 ms ago (~65 Hz frequency) or (ii) a rising edge did not occur in the generated output signal 404 during the clock cycle (for example, the last opto-isolator interrupt occurred more than 9 ms ago—thereby triggering the timeout interrupt described above), this indicates a loss of power. As a result, the processor 102b sets the global power outage flag to 1. As described above, the main thread executed by the processor 102b is monitoring the global power outage flag and when the main thread sees the flag set to 1, the processor of output detection device 102 transmits (212) a fault packet to the alerting module 106a of server computing device 106 and initiates (214) a new clock cycle for monitoring the generated output signal 404 (e.g., by reloading or resetting the timeout clock to 9 ms).

Figure 5A:
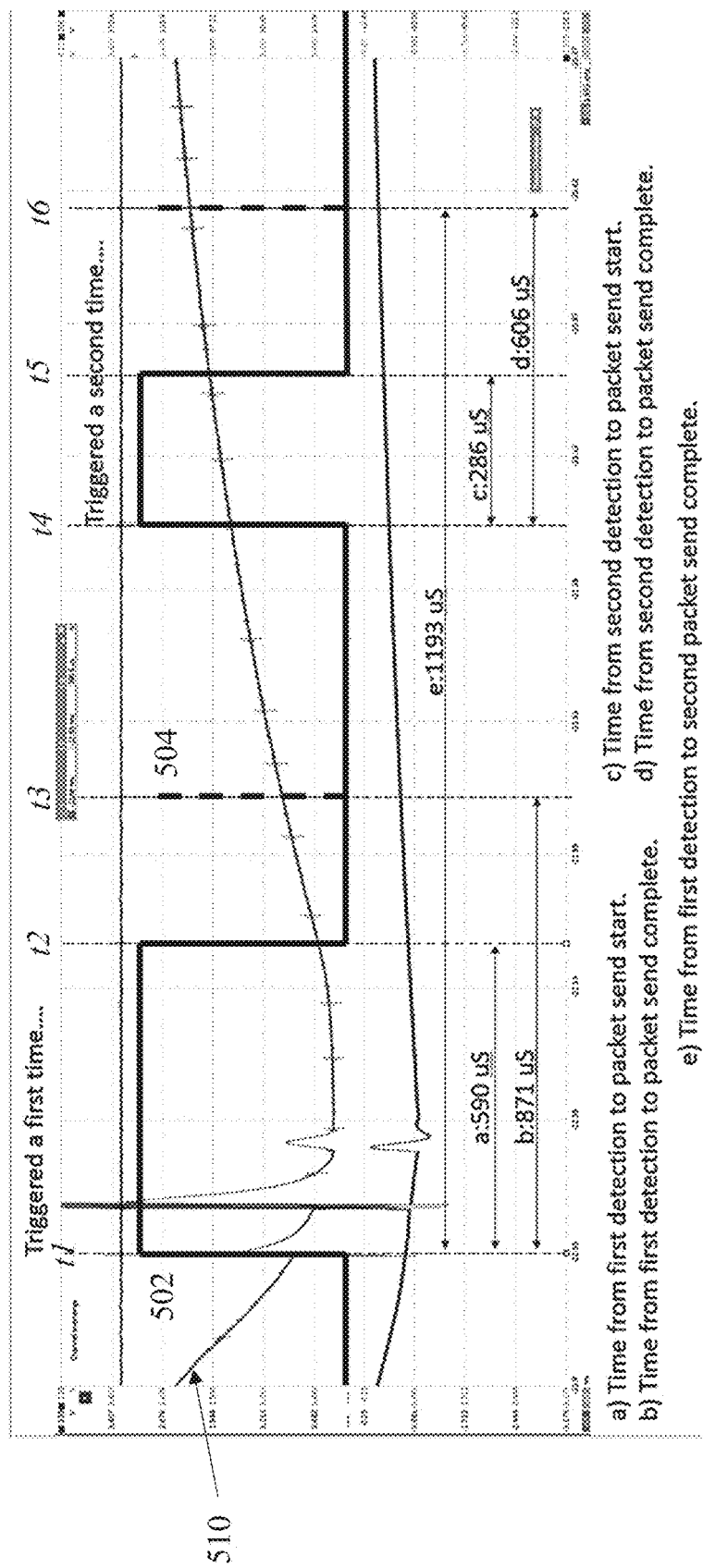
FIG. 5A is a detailed timing diagram showing the output signal generated by the outage detection device and the corresponding value of the global power outage flag when power outages are detected by the outage detection device.

FIG. 5A is a detailed timing diagram showing the output signal generated by the outage detection device 102 and the corresponding value of the global power outage flag when power outages are detected by the outage detection device 102. As shown in FIG. 5A, the trace 510 corresponds to the output signal 404 generated by the outage detection device 102. The solid black line 502 indicates the value of the global power outage flag in the main thread of the processor 102b, and the dotted black line 504 indicates when the main thread finishes sending a fault packet to the server computing device 106. For example, the processor 102b detects a power outage at time t1 and sets the global power outage flag to 1. Then, at time t2, the main thread of processor 102b reads the global power outage flag as 1 and starts transmitting a fault packet to server computing device 106. At time t3, the main thread finishes sending the fault packet to server computing device 106. The processor 102b detects a second power outage at time t4 (which could correspond to the same overall power outage) and begins transmitting a second fault packet to server computing device at time t5. Then, at time t6, the processor 102b finishes sending the second fault packet.

Alternatively, when a rising edge occurred in the generated output signal 404 at a predetermined clock value in the clock cycle (i.e., at approximately 8.33 ms), the opto-isolator interrupt process does not set the global power outage flag to 1 (and the timeout interrupt does not trigger). As a result, the processor 102b of output detection device 102 merely initiates (214) a new clock cycle for monitoring the generated output signal 404 (e.g., by reloading or resetting the timeout clock to 9 ms).

Figure 5B:
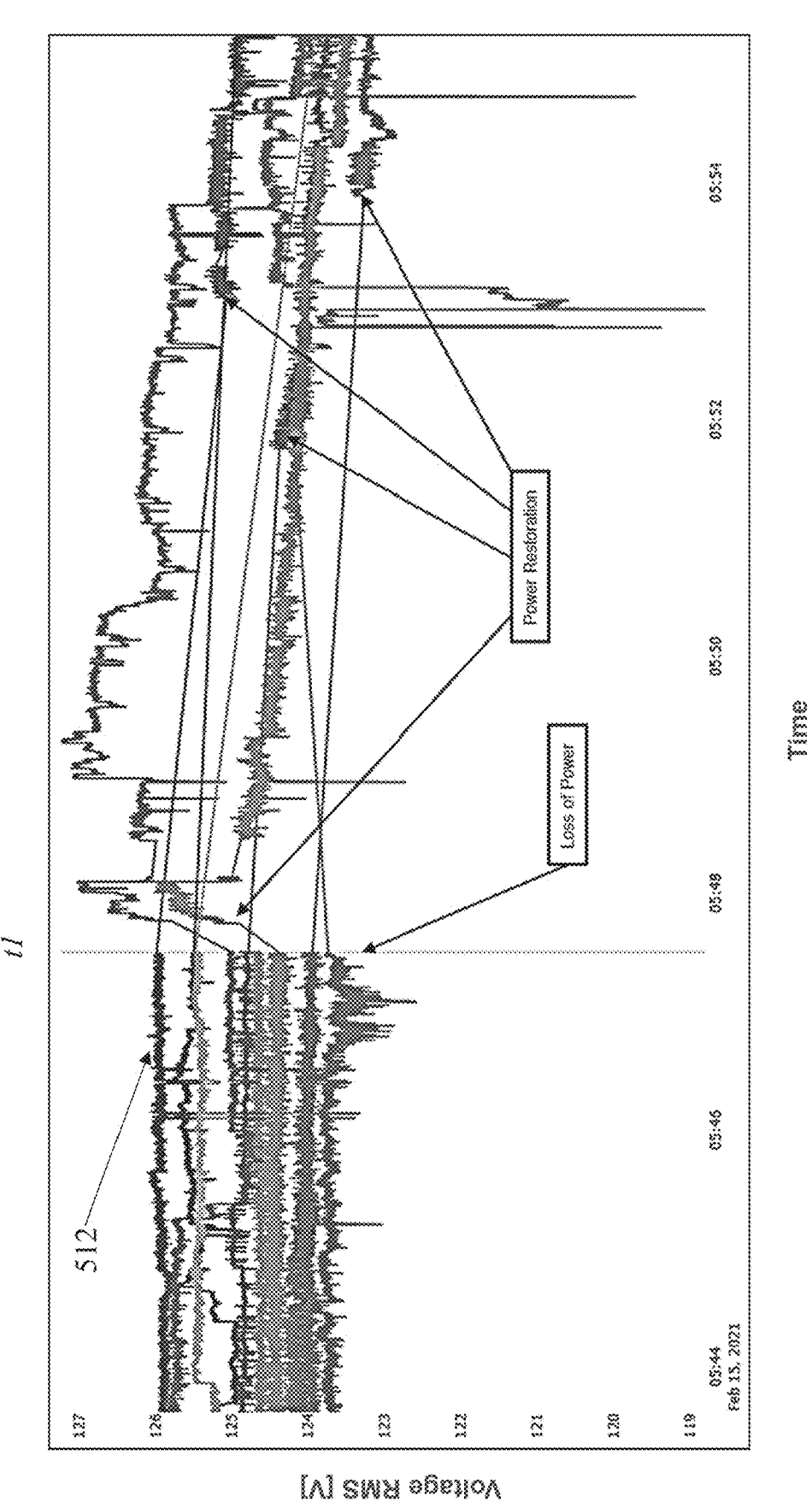
FIG. 5B is a graph of output signals from a plurality of different outage detection devices when a power outage has occurred.

FIG. 5B is a graph of output signals from a plurality of different outage detection devices when a power outage has occurred. As shown in FIG. 5B, each line (e.g., line 512) corresponds to voltage readings from an output signal of a different outage detection device. Shortly before 05:48, a power outage occurred—which is reflected in the graph at line t1 where the readings from each device suddenly stop. In the following few minutes, power is restored at different times to each of the outage detection devices—indicated by the arrows labeled 'power restoration.'

Turning to FIG. 2B, in the event that the outage detection device 102 transmits a fault packet to the server computing device 106, the alerting module 106a receives (216) the fault packet and listens (218) for keepalive packets from the outage detection device 102. As described previously, the main thread of the processor 102b of outage detection device 102 is configured to transmit a keepalive packet to the server computing device 106 every ¼ second. When the alerting module 106a receives a fault packet and does not subsequently detect any keepalive packets for at least a defined time period (e.g., 5 seconds) after the fault packet is received, the alerting module 106a transmits (220) a power outage notification to one or more remote computing devices.

Figure 6B:
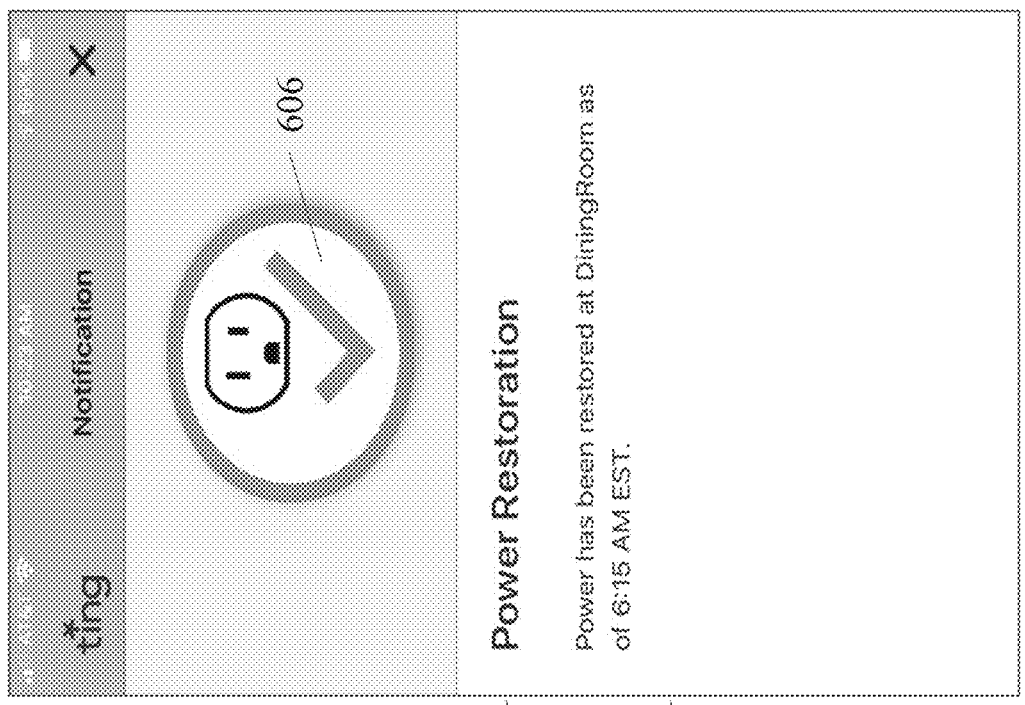
FIG. 6B is an exemplary user interface of a remote computing device that depicts a power restoration notification received from the server computing device
Figure 6A:
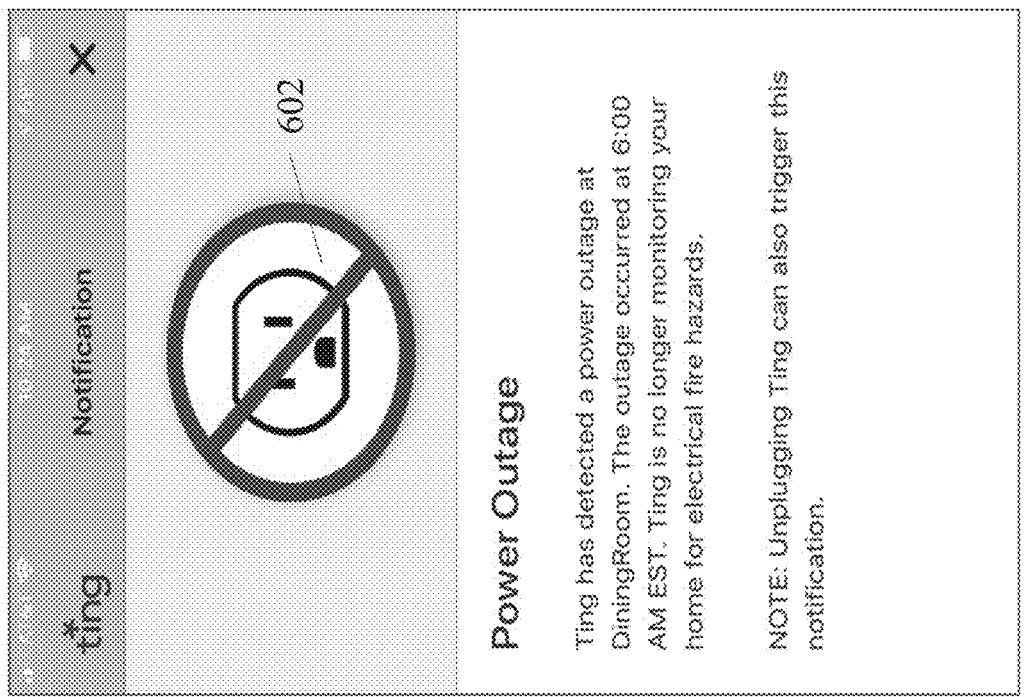
FIG. 6A is an exemplary user interface of a remote computing device that depicts a power outage notification received from the server computing device.

In some embodiments, the alerting module 106a can transmit the power outage notifications via one or more communications channels and/or communication protocols—such as email, text (e.g., SMS), and/or automated phone call—to remote computing devices like mobile phones, smart watches, smart devices, tablets, laptops, etc. In some embodiments, the alerting module 106a can transmit the power outage notifications to computing devices associated with different organizations via, e.g., webhook API callbacks, or by utilizing services from cloud computing providers such as Amazon Web Services (AWS) Simple Notification Service. In one example, the remote computing device can comprise a mobile application (app) that is configured to receive push notifications from the alerting module 106a that, when received, automatically activate functionality of the mobile app to alert a user of the remote computing device (e.g., pop-up message, audible alert, and/or haptic alert (vibration)) that a power outage is occurring at the corresponding location of the outage detection device 102. FIG. 6A is an exemplary user interface of a remote computing device (e.g., a smart phone) that depicts a power outage notification received from the alerting module 106a. As shown in FIG. 6A, the power outage notification includes a visual symbol 602 indicating a power outage event and a detailed description 604 including a time and location of the power outage.

After transmitting the power outage notification, the alerting module 106a returns to listening for keepalive packets from the outage detection device 102. When the alerting module 106a subsequently detects one or more keepalive packets (either within the defined time period or after the defined time period has elapsed) after the power outage notification is transmitted, the alerting module 106a transmits (222) a power restoration notification to the one or more remote computing devices. As described above with respect to the power outage notification, the remote computing devices can receive the power restoration notification from the alerting module 106a and activate functionality of the remote computing device to alert a user of the device that power has been restored. FIG. 6B is an exemplary user interface of a remote computing device that depicts a power restoration notification received from the alerting module 106a. As shown in FIG. 6B, the power restoration notification includes a visual symbol 606 indicating a power restoration event and a detailed description 608 including a time and location of the power restoration.

It should be appreciated that reliability of the power outage detection methodology described herein can depend upon the connectivity between the outage detection device 102 and the server computing device 106, as well as depending upon the availability of intermediate equipment which supports that connectivity. For example, the power outage detection device 102 may be connected to a local Wi-Fi router (e.g., installed in a home or business), which in turn is connected to an internet modem or router, which in turn is connected to other components within a corresponding Internet provider's network before the connection finally reaches the server computing device 106 that detects the power outage event. As a result, the fault packets must be sent by the outage detection device 102 and traverse each segment of the communication medium 104 (e.g., network) which may or may not be powered by the same power distribution system and power lines before one or more of these devices loses power and can no longer transmit, re-transmit, and/or relay the fault packets to the next link in the overall connection. It should be appreciated that if the fault packets do not reach the server computing device 106, then the server computing device 106 cannot distinguish if the keepalive packets stopped because of loss of communication connectivity (e.g., an Internet outage) or instead due to a power outage at the location of the outage detection device 102. Therefore, rapid detection of power outages and transmission of fault packets is essential to the advantages provided by the methods and systems described herein.

Figure 7:
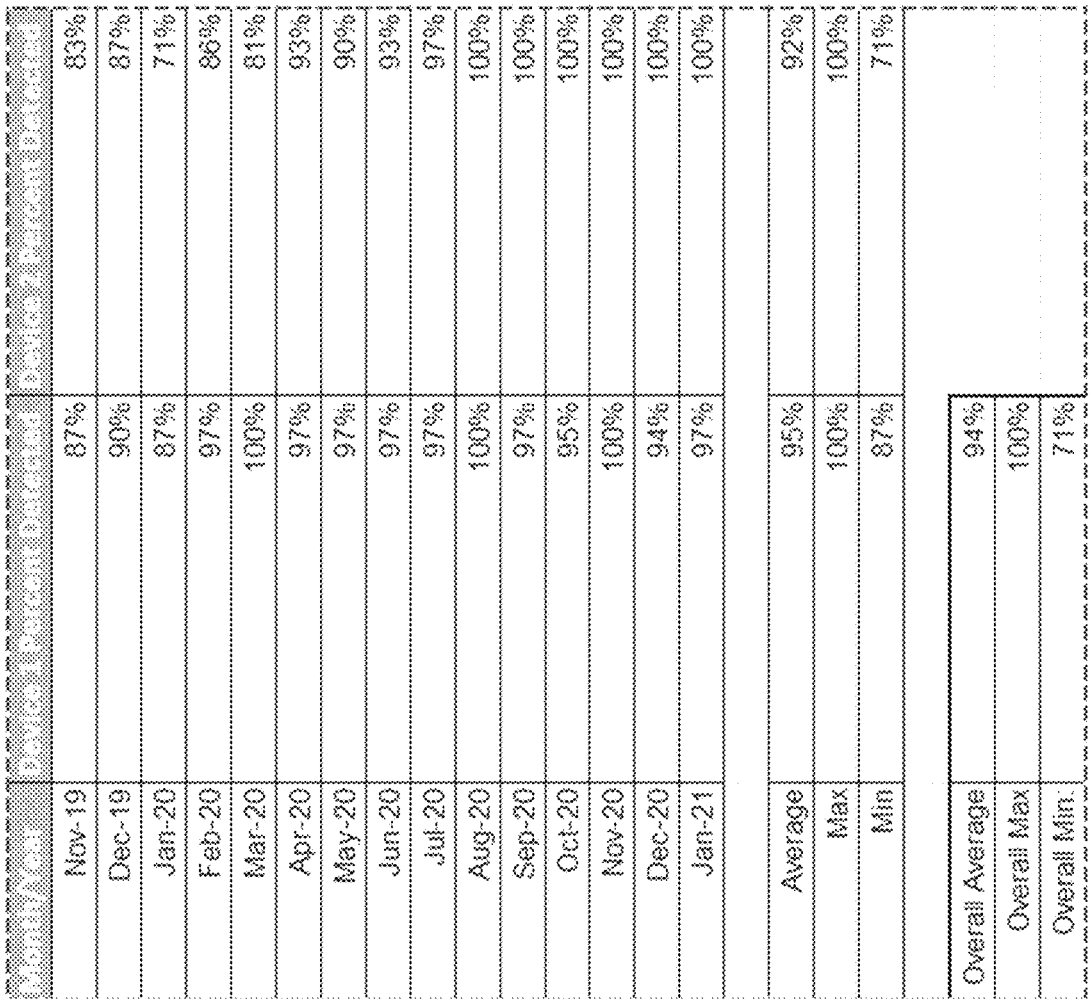
FIG. 7 is a diagram which shows the results of testing the detection efficiency of the outage detection device.

In order to determine the effectiveness of detecting power outages using this method, tests were performed using two power outage detection devices set up in two different locations. Each power outage detection device was placed on a programmable switch so that power could be turned off automatically once per day over several months. FIG. 7 is a diagram which shows the results of the testing. As shown in FIG. 7, the power outage detection devices 102 successfully detected power outages 95% of the time on average, with a maximum of 100% detection efficiency and a minimum of 71% detection efficiency.

Also, it should be appreciated that another advantage provided by the techniques described herein is the improved power outage detection and notification efficiency with scale of installation of the power outage detection devices in proximity to each other. For example, when multiple power outage detection devices are in proximity to each other, for example on the same voltage transformer which powers multiple homes, the efficiency of detecting power outages increases. If a power outage detection device 102 installed in at least one of the homes on the same electrical network is able to communicate a fault packet to the server computing device 106, and the keepalive packets stop arriving at the same time, then a power outage notification can be sent to remote devices associated with each customer on the network. The same approach can be used for a wider area electrical grid outage: if dozens of homes are powered by the same substation, then in the event of a power outage at that substation, only one power outage detection device 102 installed at a single home of the dozens of homes serviced by the substation needs to successfully transmit a fault packet to the server computing device 106 in order to generate a power outage notification to a remote device associated with customers in each of the dozens of homes. Conversely, if a dozen homes are powered by the same substation and the outage detection device 102 installed at each of the homes does not transmit a fault packet prior to loss of communications of the keepalive packets, then it can be safely assumed that the outage was the result of another non-power related occurrence (e.g., an Internet Service Provider (ISP) outage), and not the result of loss of power.

Another important feature of the methods and systems described herein is the capability to monitor the power quality of the electrical power received by the outage detection device 102 of the system 100 and provide information relating to the power monitoring to both customers (e.g., the homeowner where the power outage detection device 102 is installed) and utility providers. As mentioned previously, the power outage detection device 102 can capture additional data about the electrical power during its regular monitoring for power outages (such as, e.g., measured root mean square (RMS) voltage of the power distribution system, the frequency of the voltage sine wave, the relative phase angle of the sine wave, amplitude of the sine wave harmonics and any number of measures of the high frequency noise amplitude), and the outage detection device 102 can transmit the data to the server computing device 106 (e.g., as part of the transmission of keepalive packets to the server computing device).

Figure 8:
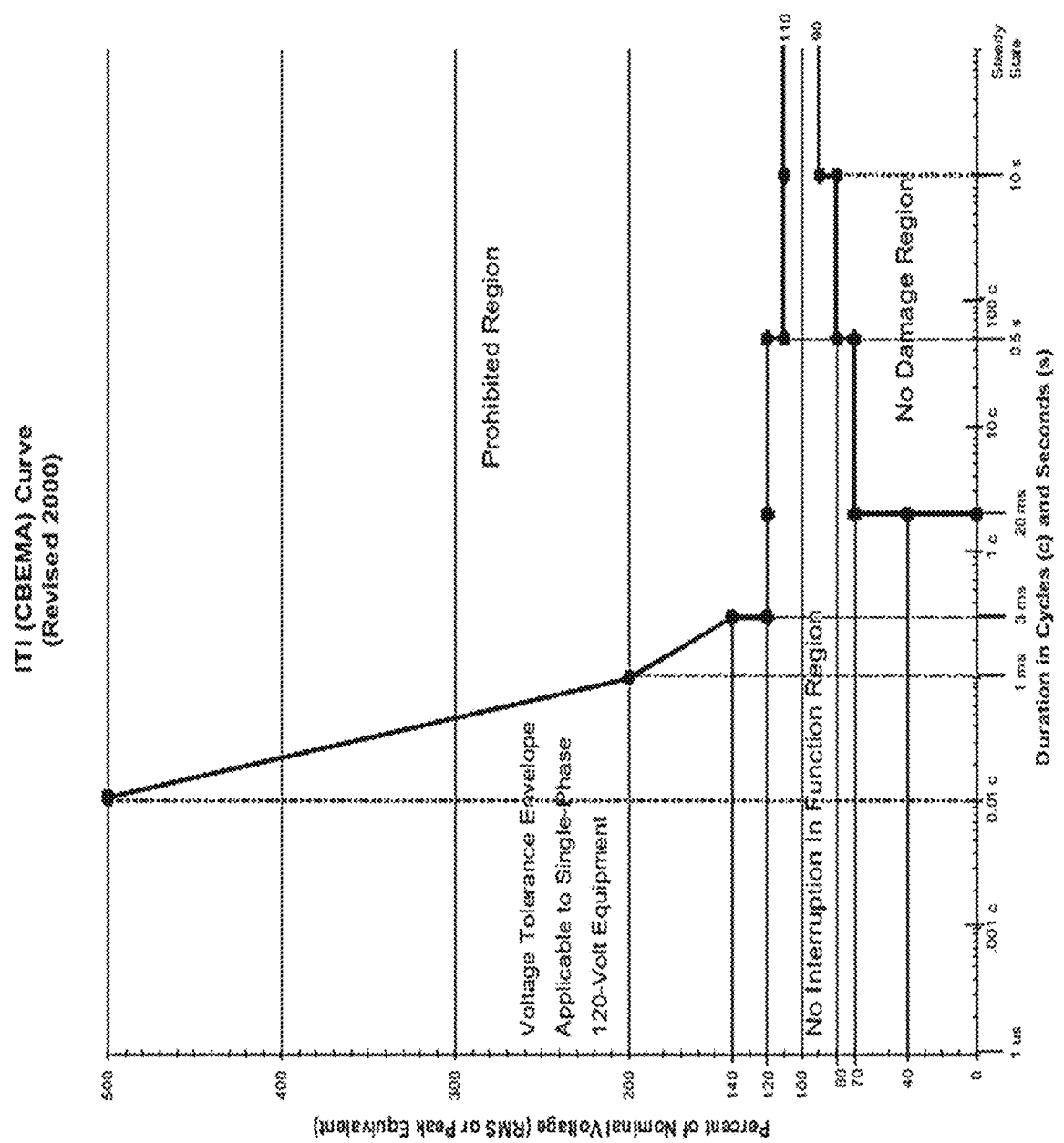
FIG. 8 is a graph of the ITI (CBEMA) curve.

As will be described in greater detail below, the outage detection device 102 can send 5 Vrms samples of the voltage to the server computing device 106 each ¼ second (or 20 Vrms readings per second). This enables the server computing device 106 to monitor for surges and sags in the voltage, which can cause damage to appliances or sensitive electronics devices that are also coupled to the power distribution system. FIG. 8 is a graph known as the ITI (CBEMA) curve. The graph shows the acceptable voltage levels within an envelope of voltage amplitude over a time duration. For example, a very short duration (~16 milliseconds) with a large voltage amplitude (300 volts) generally does not impact a device being powered on a circuit, but if the voltage amplitude remains at 300 volts for more than five seconds, it could cause damage to any devices on the electrical network. Additionally, when multiple power outage or surge and sag events occur over many days for a single location, it is recommended that the customer reach out to their electric utility. Recurring power quality problems can cause damage to appliances and sensitive electronics and may indicate more severe problems with electrical power lines coming to the residence which could cause electrical fires.

For example, if the amplitude and duration of voltage data streaming to the alerting module 106a exceed the bounds of the CBEMA curve above nominal voltage levels, the alerting module 106a sends a "Power Surge" notification message to the device of the end user. If the amplitude and duration of voltage data streaming to the alerting module 106*a* exceed the bounds of the CBEMA curve below nominal voltage levels, the alerting module 106*a* sends a "Power Brownout" notification to the end user's device.

In some embodiments, other information gathered from the voltage signal can also indicate power quality problems. For example, a measurement of the voltage sine wave frequency which has a very high variance might signal that the home is no longer using utility power, but has switched over to a generator backup. A large jump change in sine wave frequency might be an indicator that something has changed on the grid, such as a power producing plant has gone offline. This typically results in a large drop in frequency. Or, this event may indicate that a new power-producing plant has come online which can result in a large jump up in frequency. The system 100 can utilize algorithms to detect that a generator has been turned on in a home, such as measuring the frequency variance over the previous five seconds, and if the variance exceeds a threshold, after a power outage has been detected, the system 100 can send a notification to the end user's device and/or a utility monitoring device that the home is now on generator power. When the frequency variance falls back to a normal variance, then the system 100 can send a notification that the home has been restored to utility power.

While large deviations of RMS voltage outside of the limits of the CBEMA curve are most damaging to equipment in the home, smaller changes in RMS voltage can be indicators of activity within the home which can also alert a homeowner to faults with devices or to hazardous conditions. One such hazardous condition is knows as a loose neutral. A loose neutral occurs when the neutral line which normally holds the voltage level within the home to "ground" becomes disconnected. The result of a loose neutral is that the voltage on a single leg is much less stable and includes a much higher occurrence of jumps in the positive direction (increases in voltage). This is due to the imbalance of impedances on each leg which occurs when independent devices on each leg turn on and off. Large devices which run off of 220V do not create any noticeable difference in voltage jumps.

Additionally, when multiple power outage or surge and sag events occur over many days for a single location, it is recommended that the customer reach out to their electric utility. Recurring power quality problems can cause damage to appliances and sensitive electronics and may indicate more severe problems with electrical power lines coming to the residence which could cause electrical fires. A recurring power quality problem may be limited to a single home, in which case, it is likely a loose neutral, or it may occur regularly with homes on the same transformer or substation. In these cases, the recurring power quality problem may indicate a failure at a common transformer or at the substation.

Figure 9:
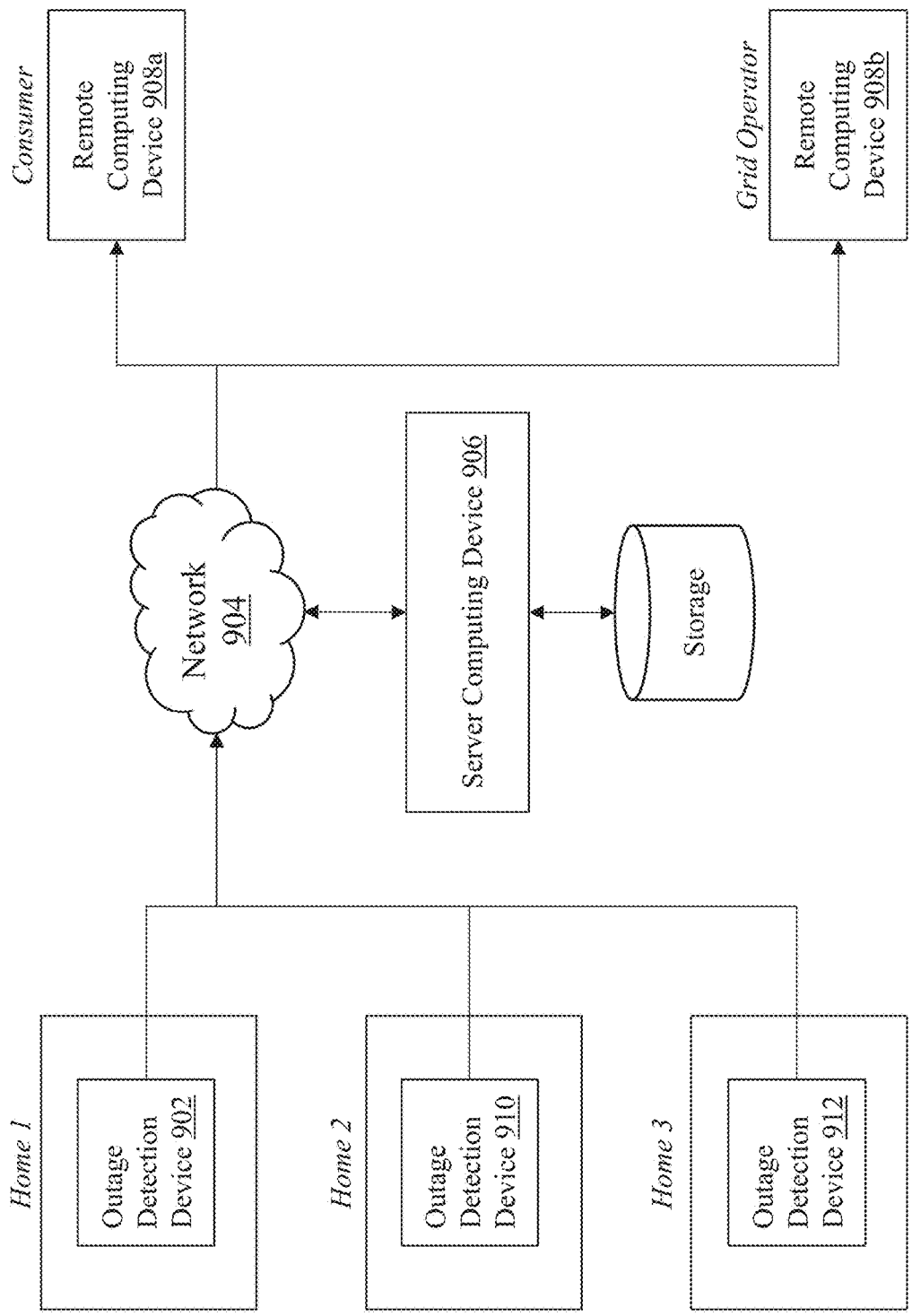
FIG. 9 is a block diagram of a networked system for power quality detection and notification.

FIG. 9 is a block diagram of a networked power quality detection and notification system 900. The system 900 of FIG. 9 uses many of the same devices as described above with respect to FIG. 1, so those descriptions will not be repeated here. As shown in FIG. 9, the system 900 comprises a plurality of outage detection devices 902, 910, 912 installed at different locations (e.g., homes, businesses) in a geographic area. These outage detection devices 902, 910, 912 provide power quality data as described above to a server computing device 906 via a communications network 904. The server computing device 906 analyzes the power quality data received from the plurality of outage detection devices 902, 910, 912 utilizing one or more power quality analysis algorithms (as will be described below) to detect power quality events and generate event notification messages that are distributed to one or more remote computing devices 908*a*, 908*b* controlled by end users (e.g., homeowners, business owners, utilities, etc.). It should be appreciated that an outage detection device (e.g., device 902) can be located at the same location as a remote computing device (e.g., device 908*a*)—for example, a homeowner can install the outage detection device 902 at his or her home and view notification messages at any of several different computing devices associated with the homeowner, such as computing devices located at the home or mobile devices that the user takes with them.

Figure 10:
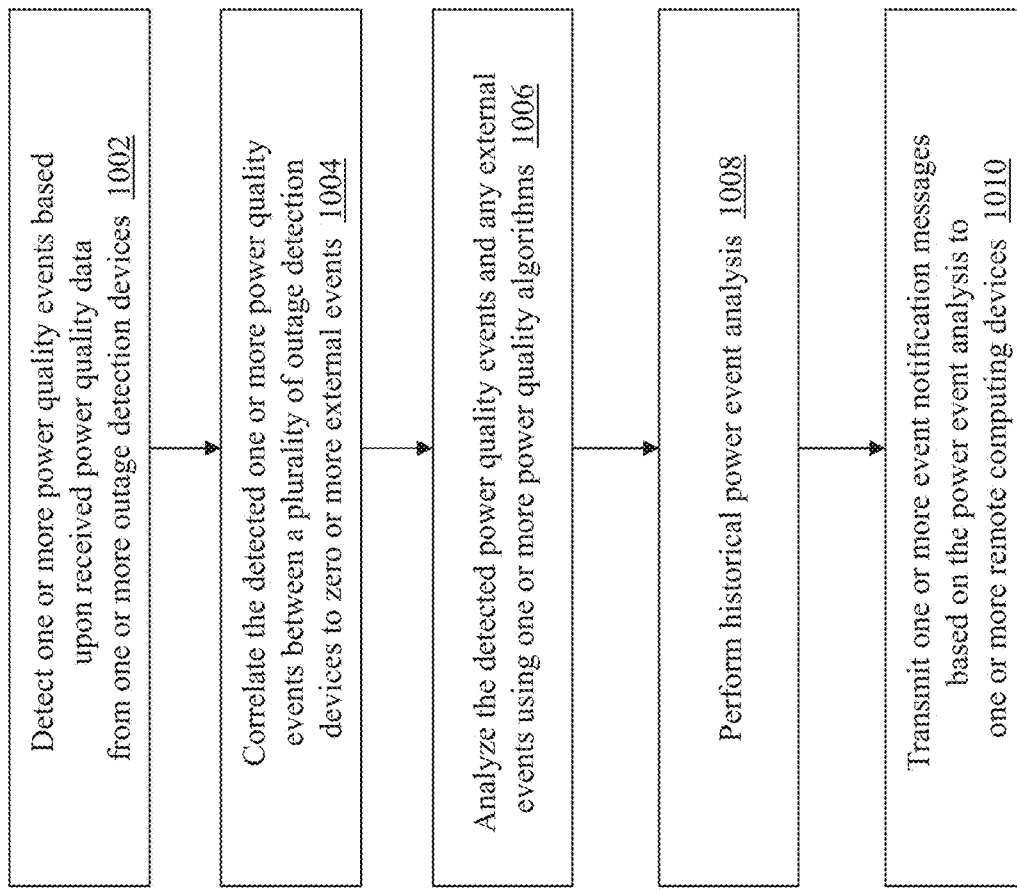
FIG. 10 is a flow diagram of a computerized method of analyzing power quality data.

FIG. 10 is a flow diagram of a computerized method of analyzing power quality data using the system 900 of FIG. 9. Upon receiving the power quality data, the server computing device 906 detects (1002) one or more power quality events occurring based upon the received power quality data. The server computing device 906 can store the captured power quality data as historical data for future reference as described herein. In some instances, it can be appreciated that no power quality events occurred in the power quality data received by the server computing device 906, so no further action is taken.

When one or more power quality events are detected, the server computing device 906 correlates (1004) the detected one or more power quality events to one or more external events that may have contributed to or influenced the power quality events. For example, lightning strikes or other weather activity may have occurred in the same geographic area as the homes or businesses being monitored by the outage detection devices 902, 910, 912. In another example, the electrical grid equipment may have executed an automatic reclosure event, in which a circuit recloser on the grid sensed a fault condition and temporarily shut off power to a portion of the grid that services homes and businesses with the outage detection devices 902, 910, 912 installed. In yet another example, changes to electricity demand on certain portions of the grid (e.g., energy pricing events) may occur that affects the power quality to homes and businesses utilizing the outage detection devices 902, 910, 912.

Once the correlation step is complete, the server computing device 906 analyzes (1006) the power quality events and external events using one or more power quality algorithms as described herein. It should be appreciated that the power quality algorithms are exemplary, and other types of algorithms can be utilized with the methods and systems described herein. Further, it should be appreciated that, in some embodiments, the outage detection device 902, 910, 912 installed at each location can perform some or all of the power quality analysis described herein as being performed by the server computing device 906 (e.g., to provide real-time customized power quality analysis for a particular location).

After analyzing the power quality events and external events, the server computing device 906 performs (1008) historical power event analysis for, e.g., the particular location, geographic area, and/or any number of outage detection devices 902, 910, 912. As described below, the system can leverage historical event data in order to detect recurrent power quality issues (e.g., sags, surges, etc.) that may be indicative of structural deficiencies with the grid and/or the home wiring system (such as a loose neutral) and which can only be detected by analyzing power quality data over a longer period of time, such as several days, weeks, or months. Finally, the server computing device 906 transmits (1010) one or more event notification messages (e.g., alert messages) based upon the above power event analysis that are then distributed to one or more remote computing device 908a, 908b as will be described in detail below.

The general structure of a power quality algorithm executed by the server computing device is as follows:

1. The server computing device 906 captures and queues a plurality of seconds of incoming power quality data.

2. The server computing device 906 detects power quality events in the incoming power quality data based on pre-defined data types and pre-defined rules (e.g., as determined from a historical data queue), including executing one or more specific power quality algorithms on the incoming data. The server computing device 906 labels the detected power quality events with certain data points, such as: time of the event, location of the event, and various detected or calculated quantities relative to the event (e.g., measured root mean square (RMS) voltage of the power distribution system, the frequency of the voltage sine wave, the relative phase angle of the sine wave, amplitude of the sine wave harmonics and any number of measures of the high frequency noise amplitude).

3. The server computing device 906 adds the detected power quality events to an event correlation queue to detect correlated events (i.e., from multiple outage detection devices or external events). For example, the external event data can be obtained from one or more remote computing devices—in the case of lightning strikes, the server computing device 906 can, e.g., communicate with a server in a lightning detection network to identify lightning events. As can be appreciated, correlated events typically occur within a time delta of the above-detected power quality events, within a location delta of the locations of the outage detection devices 902, 910, 912, and are generally the same type of events (including but not limited to the same or similar power quality characteristics, durations, start times, stop times, geographic locations, and the like). In some embodiments, a minimum number of outage detection devices may be required to agree before a correlated event is detected in order to minimize false detections.

4. The server computing device 906 stores the detected power quality events and correlated events to, e.g., long-term storage such as a NoSQL database or other type of archival storage.

5. The server computing device 906 transmits power quality notification messages to one or more remote computing devices 908a, 908b based on the detected power quality events, correlated events, and in some embodiments, historical events (e.g., generated by tracking the power quality data for a particular outage detection device 902, 910, 912 and/or geographical area over a period of time).

The following are examples of algorithms that can be used by the server computing device 906 to detect specific power quality conditions and events.

Surge Event

Generally, a surge event occurs when conditions on the electrical grid result in excess voltage being delivered to the home. In order to detect a surge event, the server computing device 906 can analyze the incoming power quality data as below.

1. The server computing device 906 captures and queues a defined amount (e.g., six seconds) of incoming RMS voltage data.

2. If the server computing device 906 determines that the RMS voltage exceeds a predefined threshold percentage (e.g., 120%) of a nominal voltage for a number of consecutive data points (or is otherwise outside of the upper part of the CBEMA curve), the server computing device 906 adds a "surge" event to an event queue with, e.g., the UTC time of the event, the location (e.g., location data such as GPS, latitude/longitude, cellular-based data, etc.) associated with the point of installation for the outage detection device that captured the incoming data), and the maximum value of RMS voltage. It should be appreciated that, in some embodiments, the predefined threshold percentage can vary based upon the number of consecutive data points in which the RMS voltage is greater than a minimum threshold percentage.

3. The server computing device 906 adds the detected surge event to be evaluated along with other surge events in a correlation event queue. The correlation event queue is evaluated to produce correlated events, which as an example includes "grid surge events" that are within a defined time period (e.g., 400 milliseconds) and a defined proximity (e.g., ten kilometers) of the detected surge event and, in some embodiments, may require a minimum number of events to agree.

4. The server computing device 906 stores the detected surge event and correlated grid surge events to, e.g., long-term storage.

5. The server computing device 906 transmits alert notification messages relating to the detected surge event and correlated events to remote computing device 908a (such as mobile phones, smart devices, wearables, etc.) associated with individual homeowners where the surge event has been detected and/or transmit notification messages relating to the detected surge event and correlated events (including external events, if detected) to remote computing device 908b of the related utilities or other grid operators.

Figure 11:
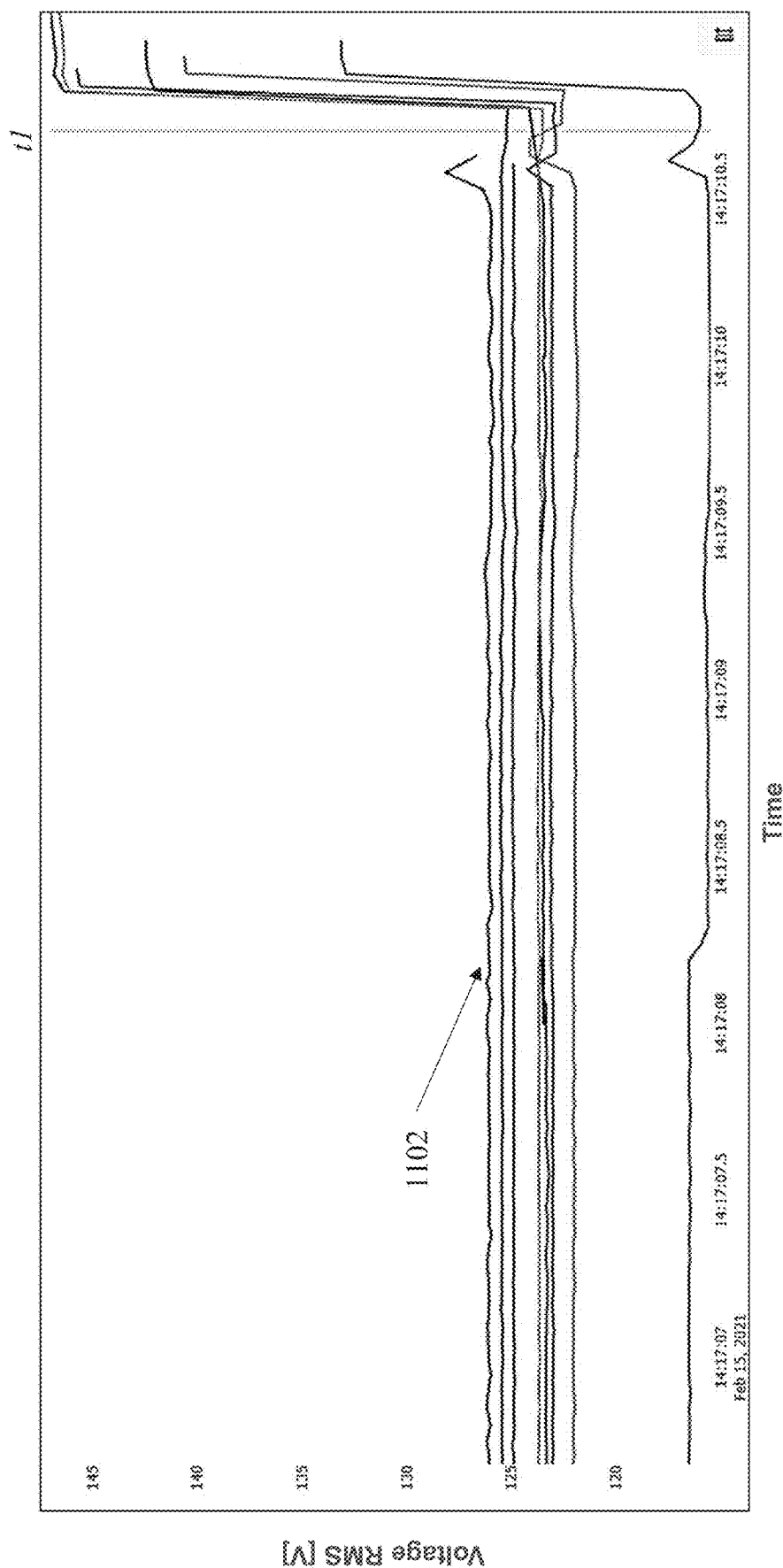
FIG. 11 is a graph showing the output signal generated by a plurality of different outage detection devices during a grid surge event.

FIG. 11 is a graph showing the output signal generated by a plurality of different outage detection devices during a grid surge event. As shown in FIG. 11, each line in the graph (e.g., line 1102) represents the output signal from a different outage detection device. Around 14:17:10 (time t1), a surge event occurred, resulting in a power outage. The RMS voltage signals received by the server computing device 906 from each of the outage detection devices increased significantly from their prior levels—indicating a surge of voltage was received by the outage detection devices.

Brownout Event

Generally, a brownout event occurs when conditions on the electrical grid result in an extended drop in the voltage being delivered to the home. In order to detect a brownout event, the server computing device 906 can analyze the incoming power quality data as below.

1. The server computing device 906 captures and queues a defined amount (e.g., six seconds) of RMS voltage data.

2. If the server computing device 906 determines that the RMS voltage is less than a predefined threshold percentage (e.g., 70%) of a nominal voltage for a number of consecutive data points (or is otherwise below the CBEMA curve), the server computing device 906 adds a "brownout" event to the event queue with, e.g., the UTC time of the event, the location, and the minimum value of RMS voltage. It should be appreciated that, in some embodiments, the predefined threshold percentage can vary based upon the number of consecutive data points in which the RMS voltage is less than a minimum threshold percentage.

3. The server computing device 906 adds the detected brownout event to be evaluated along with other brownout events in a correlation event queue. The correlation event queue is evaluated to produce correlated events, which as an example includes "grid brownout events" that are within a defined time period (e.g., 400 milliseconds) and a defined proximity (e.g., ten kilometers) of the detected brownout event and, in some embodiments, may require a minimum number of events to agree.

4. The server computing device 906 stores the detected brownout event and correlated grid brownout events to, e.g., long-term storage.

5. The server computing device 906 transmits alert notification messages relating to the detected brownout event and correlated events to remote computing device 908*a* associated with individual homeowners where the brownout event has been detected and/or transmit notification messages relating to the detected brownout event and correlated events to remote computing device 908*b* of the related utilities or other grid operators.

Figure 12:
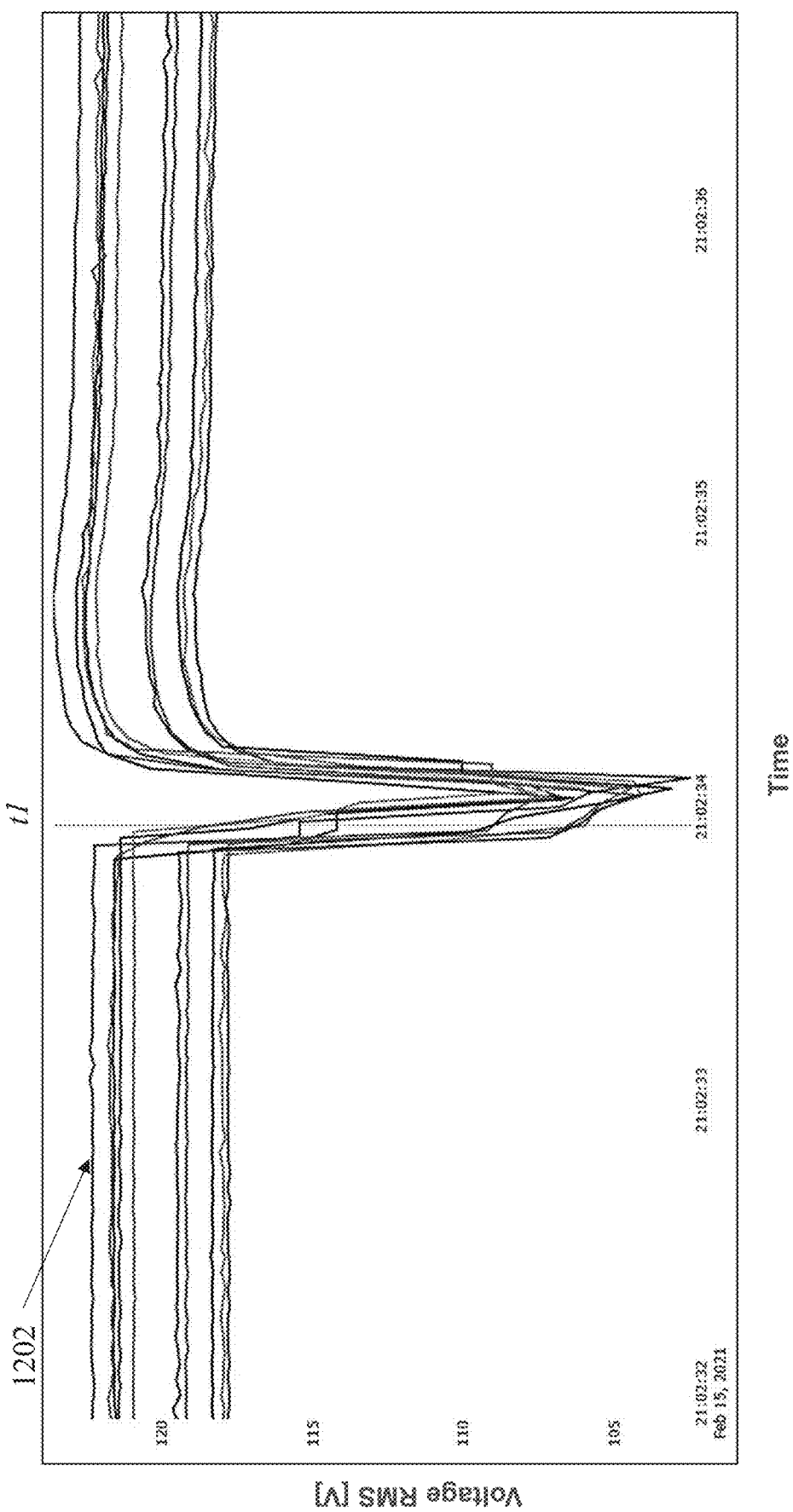
FIG. 12 is a graph showing the output signal generated by a plurality of different outage detection devices during a brownout event.

FIG. 12 is a graph showing the output signal generated by a plurality of different outage detection devices during a brownout event. As shown in FIG. 12, each line in the graph (e.g., line 1202) represents the output signal from a different outage detection device. Around 21:02:34 (time t1), a brownout event occurred. The voltage RMS signals received by the server computing device 906 from each of the outage detection devices dropped significantly over a few cycles and then returned to approximately the same voltage levels—indicating a brownout event was captured at the outage detection devices.

Sag Jump Event

Generally, a sag jump event occurs when conditions on the electrical grid result in a brief drop in the voltage being delivered to the home. In order to detect a sag jump event, the server computing device 906 can analyze the incoming power quality data as below.

1. The server computing device 906 captures and queues a defined amount (e.g., six seconds) of RMS voltage data.

2. The server computing device 906 determines whether one or more RMS voltage drops occurred that are larger than a predefined threshold percentage (e.g., 2.5%) of a nominal voltage, and the server computing device 906 generates a "sag jump" event for each detected voltage drop.

3. The server computing device 906 adds the detected sag jump event(s) (including, e.g., the UTC time of the event, the location, and the maximum value of RMS voltage drop) to a correlation event queue.

4. The server computing device 906 evaluates all sag jump events in the correlation event queue to identify sag jump events that occurred within a defined time period (e.g., 400 milliseconds) and a defined proximity (e.g., ten kilometers) of each other. In some embodiments, a minimum number of events may be required to identify correlated events.

5. The server computing device 906 stores the identified sag jump event(s) and correlated events to, e.g., long-term storage.

5. The server computing device 906 transmits alert notification messages relating to the detected sag jump event(s) and correlated events to remote computing device 908*a* associated with individual homeowners where the sag jump event(s) have been detected and/or transmit notification messages relating to the sag jump event(s) and correlated events to remote computing device 908*b* of the related utilities or other grid operators.

Figure 13:
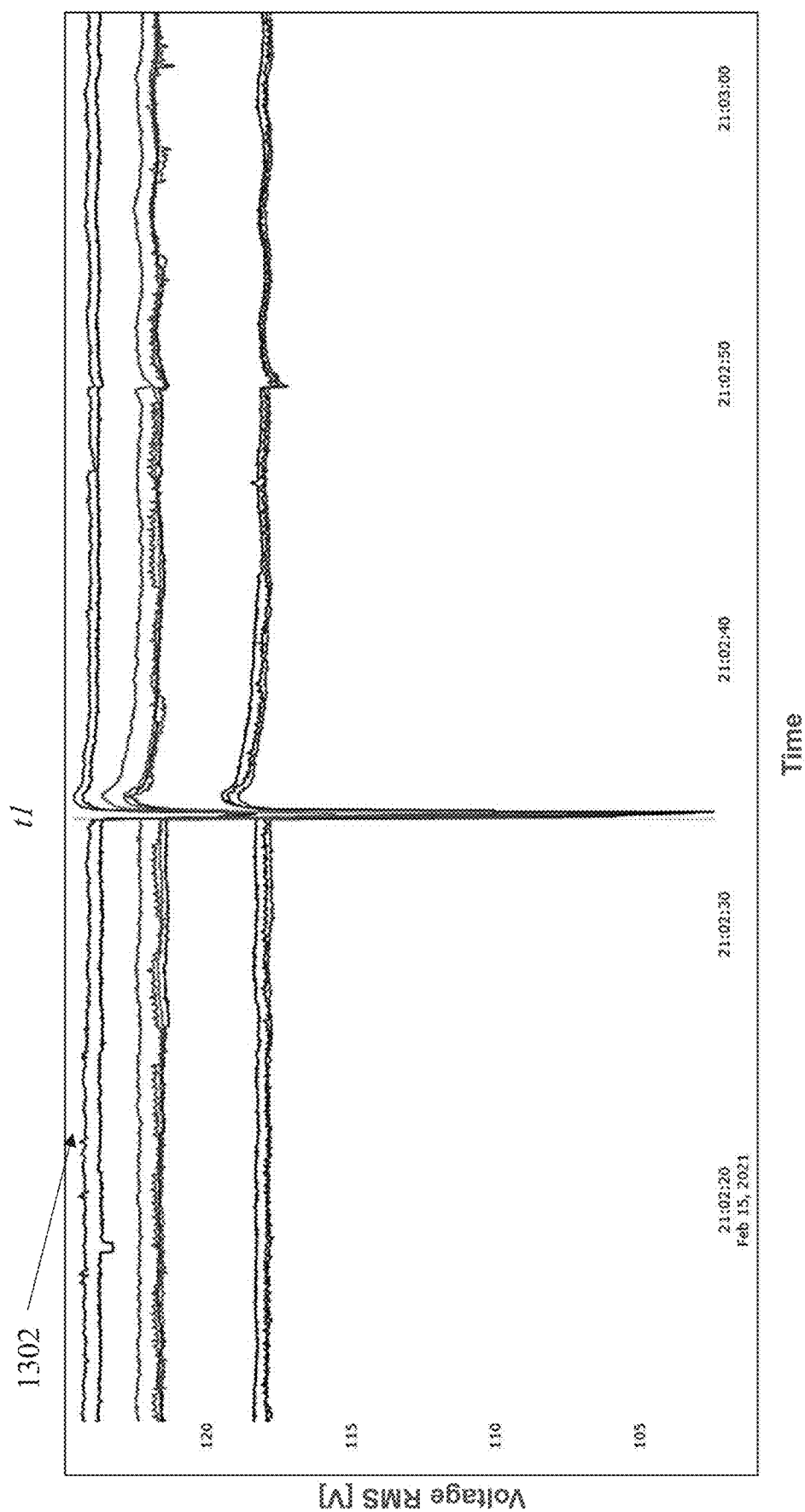
FIG. 13 is a graph showing the output signal generated by a plurality of different outage detection devices during a sag jump event.

FIG. 13 is a graph showing the output signal generated by a plurality of different outage detection devices during a sag jump event. As shown in FIG. 13, each line in the graph (e.g., line 1302) represents the output signal from a different outage detection device. Around 21:02:35 (time t1), a sag jump event occurred. The RMS voltage signals received by the server computing device 906 from each of the outage detection devices dropped significantly and then almost immediately returned to approximately the same voltage levels—indicating a sag jump event was captured at the outage detection devices.

Swell Jump Event

Generally, a swell jump event occurs when conditions on the electrical grid result in an increase in the voltage being delivered to the home. In some cases, a swell jump event can occur when a heavy load turns off in the electrical system. In order to detect a swell jump event, the server computing device 906 can analyze the incoming power quality data as below.

1. The server computing device 906 captures and queues a defined amount (e.g., six seconds) of RMS voltage data.

2. The server computing device 906 determines whether one or more RMS voltage increases occurred that are larger than a predefined threshold percentage (e.g., 2.5%) of a nominal voltage, and the server computing device 906 generates a "swell jump" event for each detected voltage increase.

3. The server computing device 906 adds the detected swell jump event(s) (including, e.g., the UTC time of the event, the location, and the maximum value of RMS voltage increase) to a correlation event queue.

4. The server computing device 906 evaluates all swell jump events in the correlation event queue to identify swell jump events that occurred within a defined time period (e.g., 400 milliseconds) and a defined proximity (e.g., ten kilometers) of each other. In some embodiments, a minimum number of events may be required to identify correlated events.

5. The server computing device 906 stores the identified swell jump event(s) and correlated events to, e.g., long-term storage.

6. The server computing device 906 transmits alert notification messages relating to the detected swell jump event(s) and correlated events to remote computing device 908*a* associated with individual homeowners where the swell jump event(s) have been detected and/or transmit notification messages relating to the swell jump event(s) and correlated events to remote computing device 908*b* of the related utilities or other grid operators.

Figure 14:
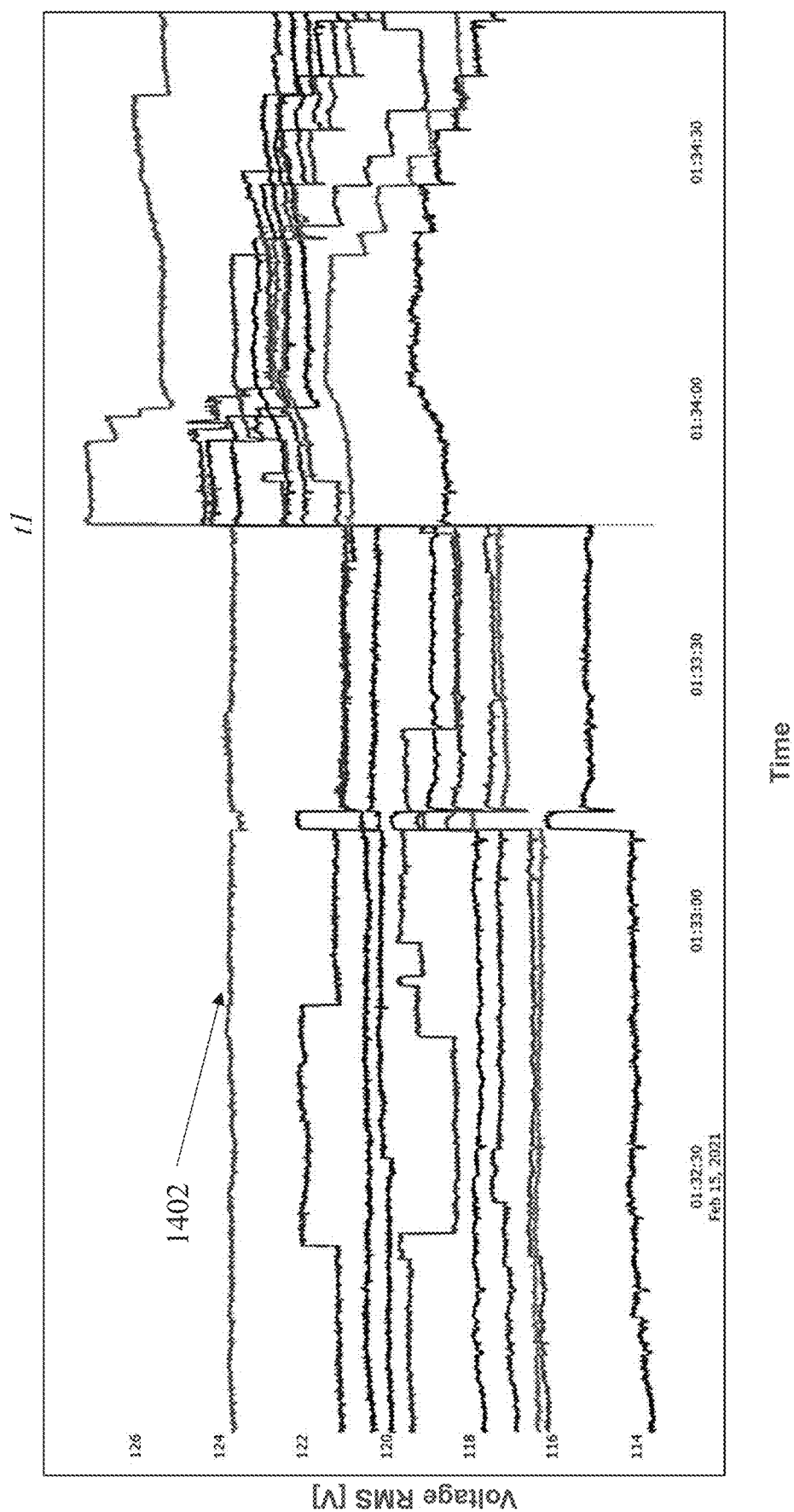
FIG. 14 is a graph showing the output signal generated by a plurality of different outage detection devices during a swell jump event.

FIG. 14 is a graph showing the output signal generated by a plurality of different outage detection devices during a swell jump event. As shown in FIG. 14, each line in the graph (e.g., line 1402) represents the output signal from a different outage detection device. Around 01:33:50 (time t1), a swell jump event occurred. The voltage RMS signals received by the server computing device 906 from each of the outage detection devices almost immediately increase to higher voltage levels—indicating a swell jump event was captured at the outage detection devices.

High Frequency (HF) Filter Event

As mentioned above, the outage detection device 902, 910, 912 can monitor certain power quality data including high frequency amplitude of power coming into the home, which can cause damage to wiring and appliances in the home. In order to detect a high frequency filter event, the server computing device 906 can analyze the incoming power quality data as below.

1. The server computing device 906 captures and queues a defined amount (e.g., six seconds) of High Frequency (HF) amplitude data.

2. The server computing device 906 calculates a sliding mean of the High Frequency (HF) amplitude data. If the mean is greater than one, then the server computing device 906 generates a HF Filter event when the HF amplitude data jumps by more than a predefined multiple (e.g., five) of the mean. If the mean is less than one, then the server computing device 906 generates an event when the HF amplitude data jumps above a predefined threshold (e.g., five). It can be appreciated that, in some embodiments, the selected jump thresholds for identifying HF Filter events may vary based on different signal to noise thresholds or other features of the HF data.

3. The server computing device 906 adds the HF Filter event(s) (including, e.g., the UTC time of the event, the location, and the magnitude of the HF amplitude jump) to a correlation event queue.

4. The server computing device 906 evaluates all HF Filter jump events in the correlation event queue to identify HF Filter events that occurred within a defined time period (e.g., 400 milliseconds) and a defined proximity (e.g., ten kilometers) of each other. In some embodiments, a minimum number of events may be required to identify correlated events.

5. The server computing device 906 stores the identified HF Filter event(s) and correlated events to, e.g., long-term storage.

6. The server computing device 906 transmits alert notification messages relating to the detected HF Filter event(s) and correlated events to remote computing device 908*a* associated with individual homeowners where the HF Filter event(s) have been detected and/or transmit notification messages relating to the HF Filter event(s) and correlated events to remote computing device 908*b* of the related utilities or other grid operators.

Figure 15:
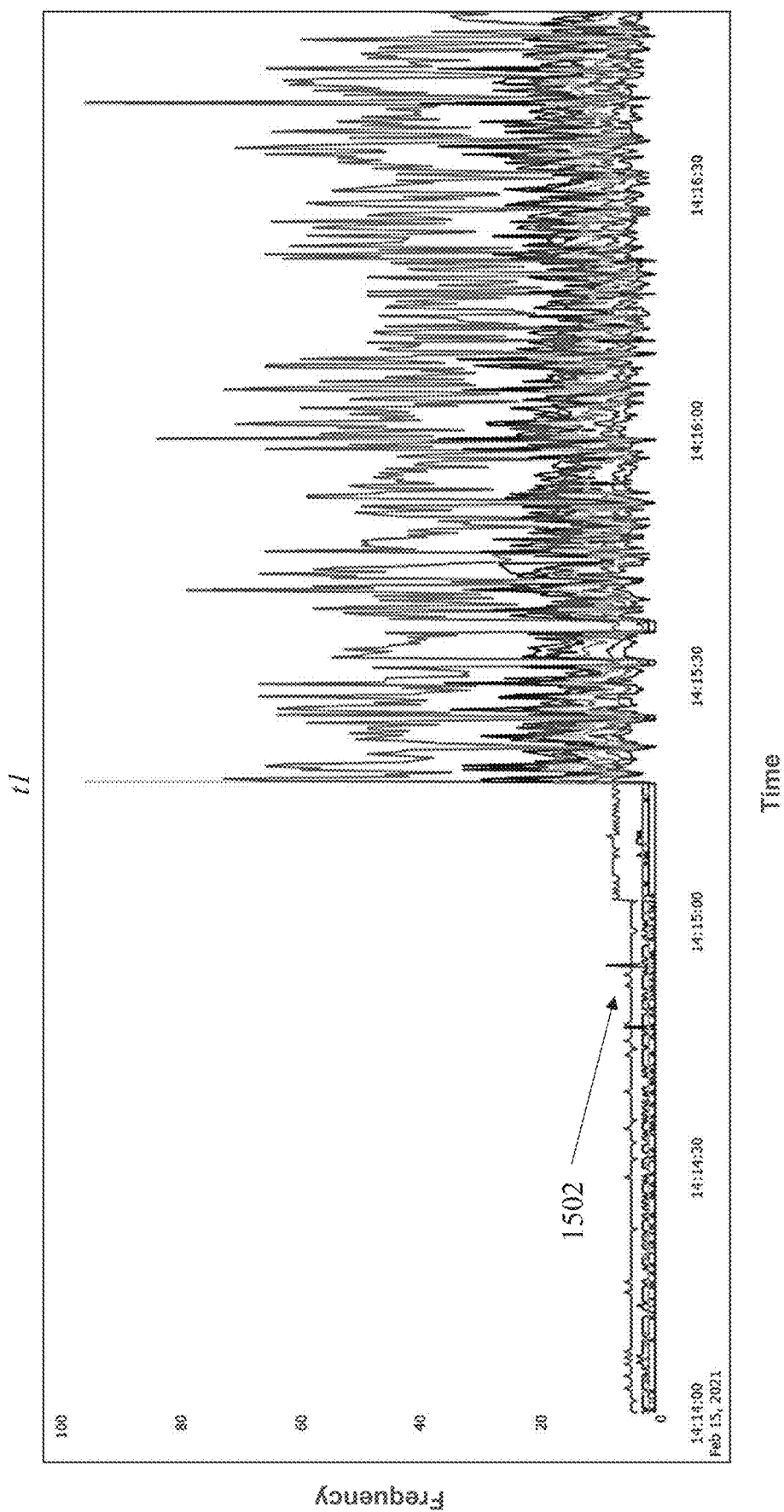
FIG. 15 is a graph showing the output signal generated by a plurality of different outage detection devices during a HF Filter jump event.

FIG. 15 is a graph showing the output signal generated by a plurality of different outage detection devices during a HF Filter jump event. As shown in FIG. 15, each line in the graph (e.g., line 1502) represents the output signal from a different outage detection device. Around 14:15:20 (time t1), an HF Filter jump event occurred. The frequency signals received by the server computing device 906 from each of the outage detection devices almost immediately increase to higher levels and are much noisier with wide variation of frequencies in each signal—indicating an HF Filter jump event was captured at the outage detection devices.

It should be appreciated that the system can be further configured to detect incipient arcing events on the electrical grid. For example, when the system detects multiple HF Filter events over time without any changes in voltage or frequency of phase angle, the system can determine that the HF Filter events correspond to an incipient arcing event—thereby detecting a dangerous condition at a very early stage. The system can then alert the grid operator and/or utility provider that the arcing condition exists as well as a possible geographic area or location of the condition, so that the operator can quickly assess and remedy the problem.

Frequency Event

As mentioned above, the outage detection device 902, 910, 912 can monitor certain power quality data including frequency of power coming into the home, which under certain conditions—including sudden increases or decreases—can cause damage to wiring and appliances in the home. In order to detect a frequency event, the server computing device 906 can analyze the incoming power quality data as below.

1. The server computing device 906 captures and queues a defined amount (e.g., six seconds) of frequency data.

2. The server computing device 906 calculates a sliding average of the frequency data. If the frequency jumps by more than a predefined threshold (e.g., 0.05 Hz) from the average, then the server computing device 906 generates a frequency event. The server computing device 906 also calculates the standard deviation of the frequency and generates a frequency event if (i) standard deviation changes from less than a lower threshold (e.g., 0.025 Hz) to greater than a higher threshold (e.g., 0.05 Hz) or (ii) if the standard deviation changes from greater than the higher threshold (e.g., 0.05 Hz) to less than the lower threshold (e.g., 0.025 Hz).

3. The server computing device 906 adds the frequency event (including, e.g., the UTC time of the event, the location, the maximum value of the frequency jump and the standard deviation of the frequency) to a correlation event queue.

4. The server computing device 906 evaluates all frequency events in the correlation event queue to identify frequency events that occurred within a defined time period (e.g., 400 milliseconds) and a defined proximity (e.g., ten kilometers) of each other. In some embodiments, a minimum number of events may be required to identify correlated events.

5. The server computing device 906 stores the identified frequency event and correlated events to, e.g., long-term storage.

6. The server computing device 906 transmits alert notification messages relating to the detected frequency event and correlated events to remote computing device 908*a* associated with individual homeowners where the frequency event have been detected and/or transmit notification messages relating to the frequency event and correlated events to remote computing devices 908 of the related utilities or other grid operators.

Figure 16:
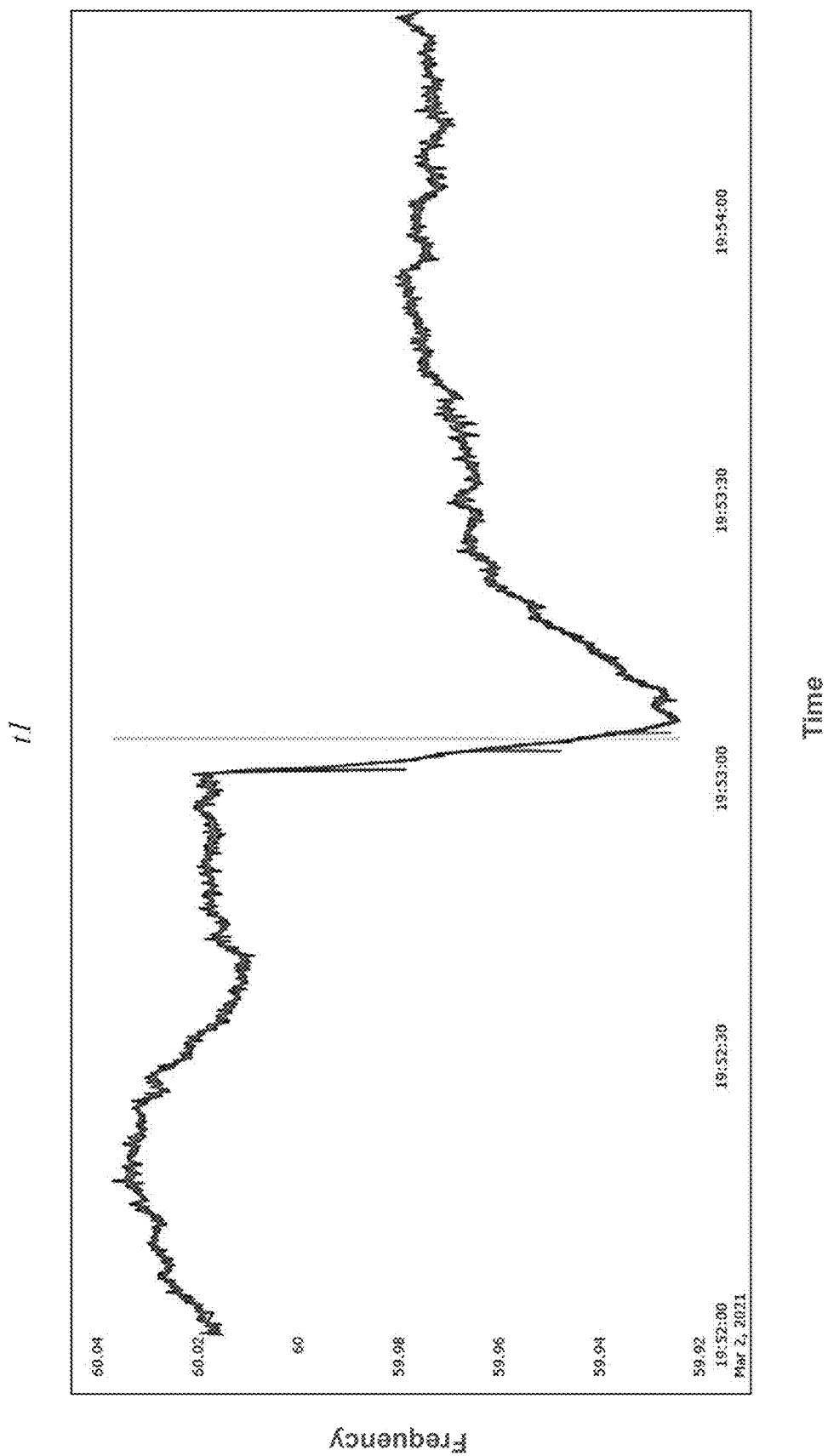
FIG. 16 is a graph showing the output signal generated by a plurality of different outage detection devices during a frequency jump event.

FIG. 16 is a graph showing the output signal generated by a plurality of different outage detection devices during a frequency jump event. As shown in FIG. 16, each line in the graph represents the output signal from a different outage detection device. Note that in this graph, the output signals for each of the outage detection devices are very close together, giving the graph an appearance of having a single line. Around 19:53:00 (time t1), a frequency event occurred. The frequency signals received by the server computing device 906 from each of the outage detection devices drop to lower frequencies and then begin to rise—indicating a frequency event was captured at the outage detection devices.

Loose Neutral Event

As mentioned above, a loose neutral is a very dangerous condition that can exist in the wiring of a home. Typically, a loose neutral wire becomes disconnected from its point of connection which can cause abnormally high or low voltage conditions at outlets within a home. In some cases, the current will flow to ground through other devices in a home, for example through a television set to the cable TV connection. Because large currents may flow through cable TV cables or other conductors which or not designed to handle such large currents, this can result in arcing, or situations where the conductor becomes very hot, burning its insulation off and even causing damage to its surroundings—potentially leading to an electrical fire. In some instances, a neutral wire can be resistive. The neutral's resistance is low enough to conduct some electricity, but too high to conduct as well as it should. In these cases, the neutral can become very hot at the location where the resistance is higher than normal, which may also cause a fire. In order to detect a loose neutral event, the server computing device 906 can analyze the incoming power quality data as below.

1. The server computing device 906 retrieves historical power quality event data and historical correlated event data for the particular outage detection device 902, 910, 912 from, e.g., long-term storage. For example, as noted above, the system can capture and record power quality data from an outage detection device in a particular home over time and store the data in long-term storage, in order to establish a historical record of power quality events associated with the home.

2. The server computing device 906 evaluates, for a single outage detection device 902, the number and amplitude of surge events, surge jump events, sag events that were recorded for that outage detection device 902 within a predetermined time period (such as within the last seven days) and which are not correlated with other events.

3. If the average number of surge events is greater than a predefined threshold (e.g., one) per day, or the average number of surge jump events with magnitude greater than a predefined threshold percentage (e.g., 10%) of a nominal voltage is greater than a predefined threshold (e.g., ten) per day, or the average number of sag events is greater than a predefined threshold (e.g., ten) per day (as exemplary conditions), the server computing device 906 generates a loose neutral event and can store the loose neutral event data in, e.g., long-term storage.

4. The server computing device 906 transmits a notification message relating to the loose neutral event to, e.g., a remote computing device 908a associated with the user. In some embodiments, the notification message can be also sent to, e.g., a remote computing device 908b associated with a utility provider servicing the home so that they can determine potential repairs to ameliorate the loose neutral condition.

Figure 17A:
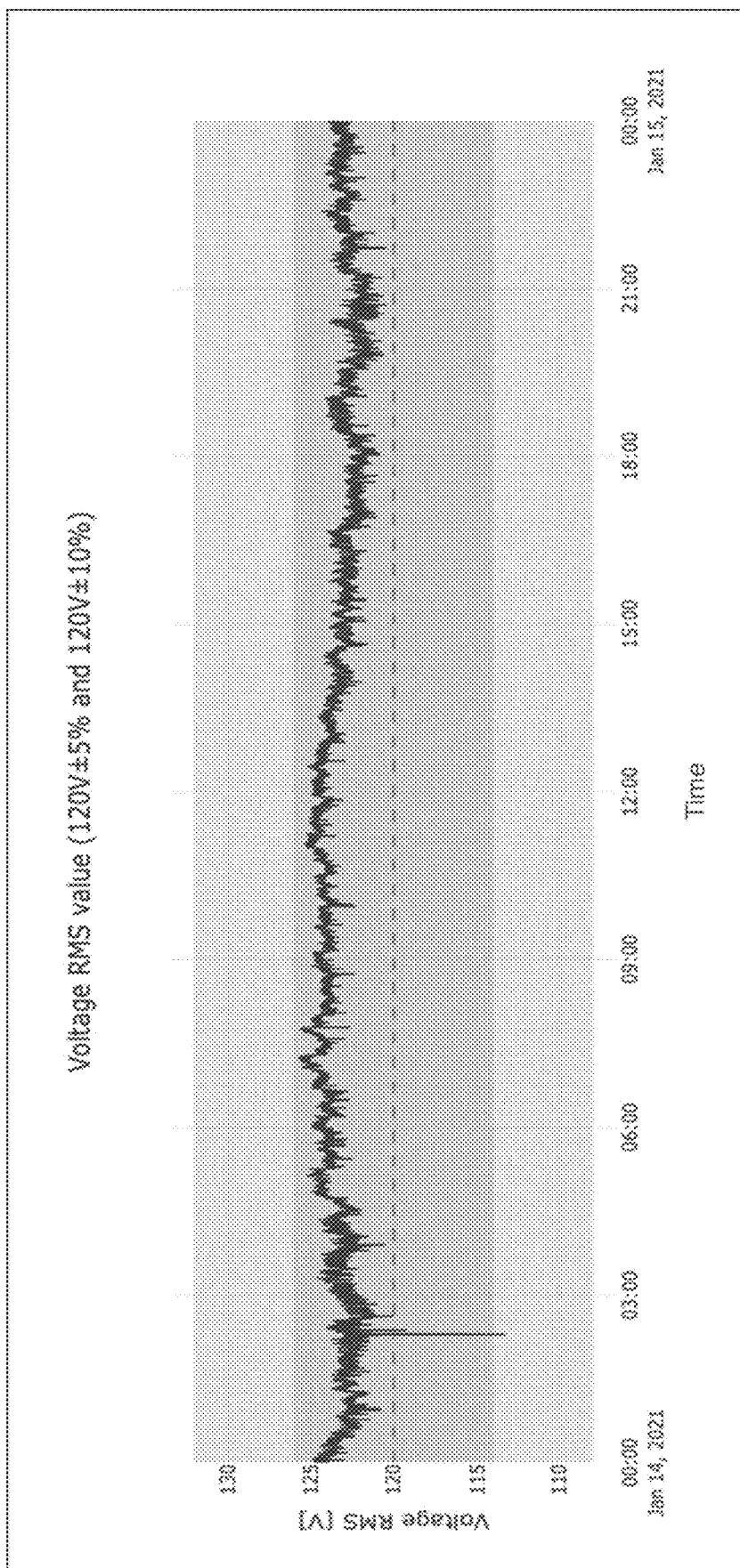
FIG. 17A is a graph of nominal Voltage Root Mean Square (RMS) readings captured by an outage detection device.
Figure 17B:
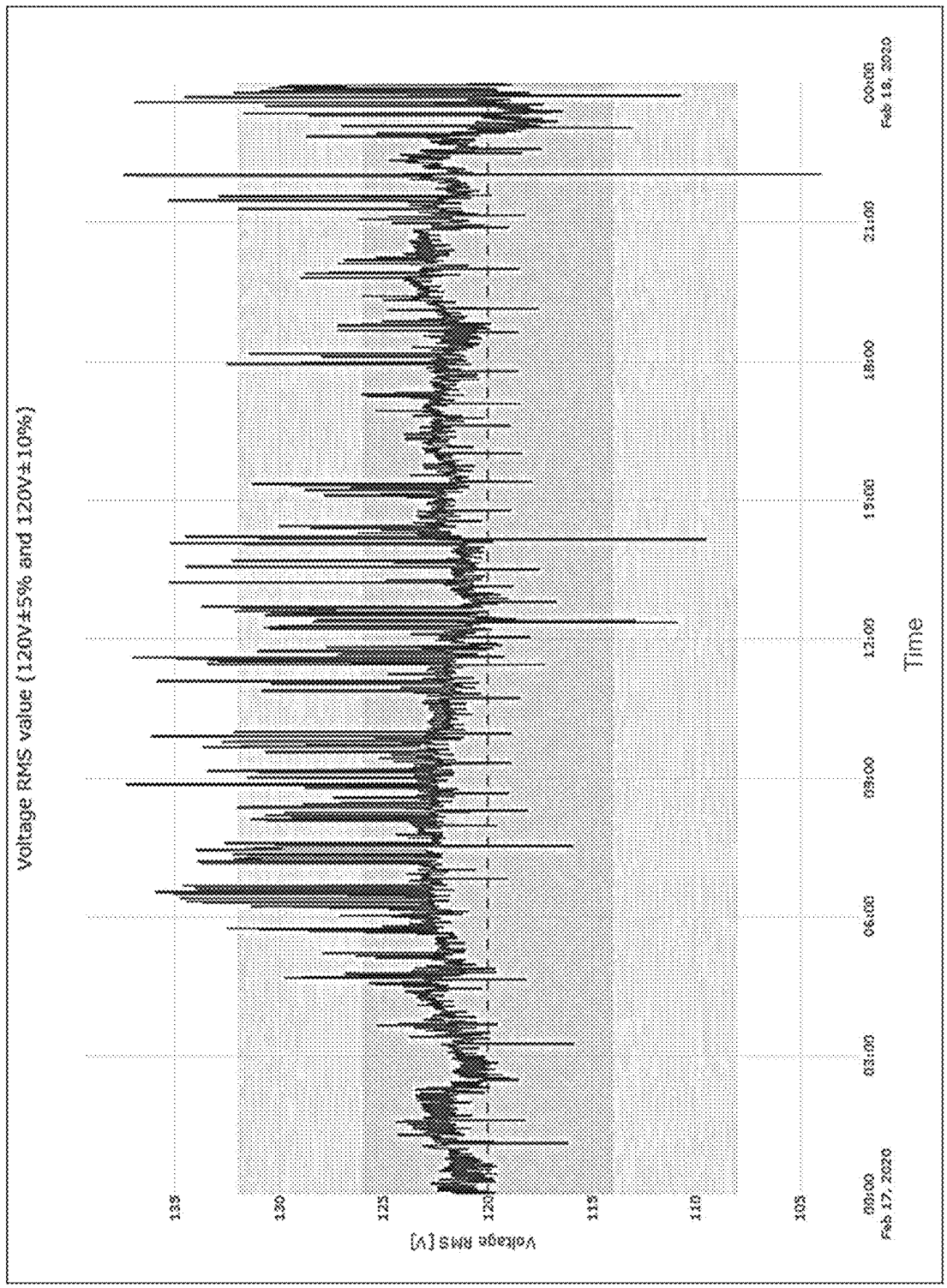
FIG. 17B is a graph of Voltage RMS readings captured by an outage detection device showing an example loose neutral connection.
Figure 17C:
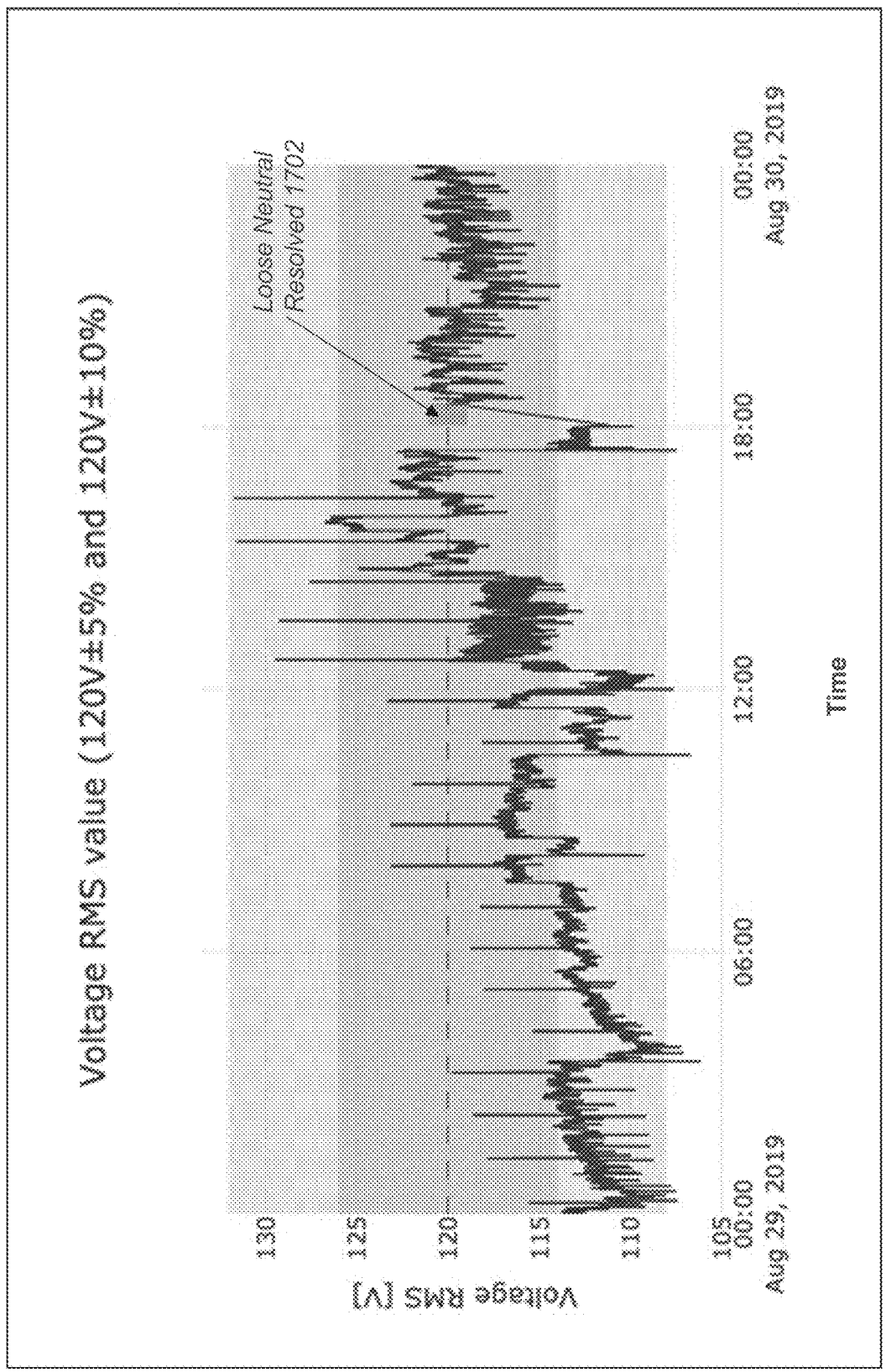
FIG. 17C is a graph of Voltage RMS readings captured by an outage detection device before and after resolution of a loose neutral connection.

As an example, FIGS. 17A-17C are graphs generated from power quality data captured by an outage detection device 902 relating to a loose neutral event. FIG. 17A depicts a graph of nominal Voltage RMS readings captured by an outage detection device—as shown in FIG. 17A, the Voltage RMS value is relatively constant over time. But, when a loose neutral exists, the outage detection device 902 captures many large positive jumps (e.g., >+10% of the nominal value) of the Voltage RMS value—as shown in the graph of FIG. 17B. Similarly, FIG. 17C is a graph that shows the Voltage RMS readings captured by an outage detection device 902 before and after resolution of a loose neutral. As shown in FIG. 17C, the Voltage RMS readings contain many large jumps prior to the resolution point 1702, then the Voltage RMS readings return to the range of nominal values without the large jumps.

Below is a table detailing the number of loose neutral connections detected by outage detection devices in a real world deployment of the system described herein:

| Month | # of Loose Neutrals Detected |
|---|---|
| January 2020 | 1 |
| February 2020 | 1 |
| March 2020 | 4 |
| April 2020 | 1 |
| May 2020 | 2 |
| June 2020 | 1 |
| July 2020 | 1 |
| August 2020 | 5 |
| September 2020 | 3 |
| October 2020 | 5 |
| November 2020 | 11 |

-continued

| Month | # of Loose Neutrals Detected |
|---|---|
| December 2020 | 32 |
| January 2021 | 24 |
| February 2021 | 19 |

As shown above, in each case the system detected one or more loose neutral events associated with a particular outage detection device and generated an alert notification to the associated end user devices, so the homeowner was made aware of the existence of the loose neutral. In each case, the loose neutral was subsequently verified and fixed by the utility provider. There are an additional 49 cases currently open and in the process of being resolved. The above data shows the significant benefit provided by the systems and methods described herein from the perspective of quickly and accurately detecting power quality problems in the home before any potential loss of property or loss of life occurs.

Recurring Power Quality Problem Event

Other types of recurring problems with power quality (e.g., frequent surges, sags, etc.) can occur when delivering electricity to a home. In order to detect these problems, the server computing device 906 can analyze the incoming power quality data as below.

1. The server computing device 906 retrieves historical power event data and historical correlated event data for the particular outage detection device 902, 910, 912 from, e.g., long-term storage.

2. The server computing device 906 evaluates, for a single outage detection device 902, the number and amplitude of surge events and sag events that were recorded for that outage detection device 902 within a predetermined time period (such as within the last thirty days).

3. If more than a predefined number (e.g., four) of surge events or more than a predefined number (e.g., ten) of sag events occurred (as exemplary conditions), the server computing device 906 generates a recurring power quality problem event and can store the recurring power quality problem event data in, e.g., long-term storage.

4. The server computing device 906 transmits a notification message relating to the recurring power quality problem event to, e.g., a remote computing device 908a associated with the user. In some embodiments, the notification message can be also sent to, e.g., a remote computing device 908b of a utility provider servicing the home so that they can determine potential repairs to ameliorate the recurring power quality problem.

Generator On/Off Event

The methods and systems described herein can also be used to detect scenarios when alternative power generation systems (such as generators installed in homes) are activated in response to a power outage. In order to detect these situations, the server computing device 906 can analyze the incoming power quality data as below.

1. The server computing device 906 retrieves historical power event data and historical correlated event data for the particular outage detection device 902, 910, 912 from, e.g., long-term storage.

2. The server computing device 906 evaluates, for a single outage detection device 902, whether any power outage events and frequency events occurred.

3. If the single outage detection device 902 records a power outage event, followed by a frequency standard deviation change to greater than a predefined threshold (e.g., 0.05 Hz) within a predefined period of time (e.g., sixty seconds) of the power outage event and the frequency standard deviation change was not associated with a correlated external event, then the server computing device 906 generates a "Generator On" event and can transmit a corresponding notification message to, e.g., a remote computing device 908*a* associated with the user of the outage detection device 902.

4. If a single outage detection device 902 which has previously met the conditions for a "Generator On" event records a subsequent frequency event for standard deviation of frequency change to less than 0.025 Hz, then the server computing device 906 generates a "Generator Off" event and can transmit a corresponding notification message to, e.g., a remote computing device 908*a* associated with the user of the outage detection device 902.

Figure 18:
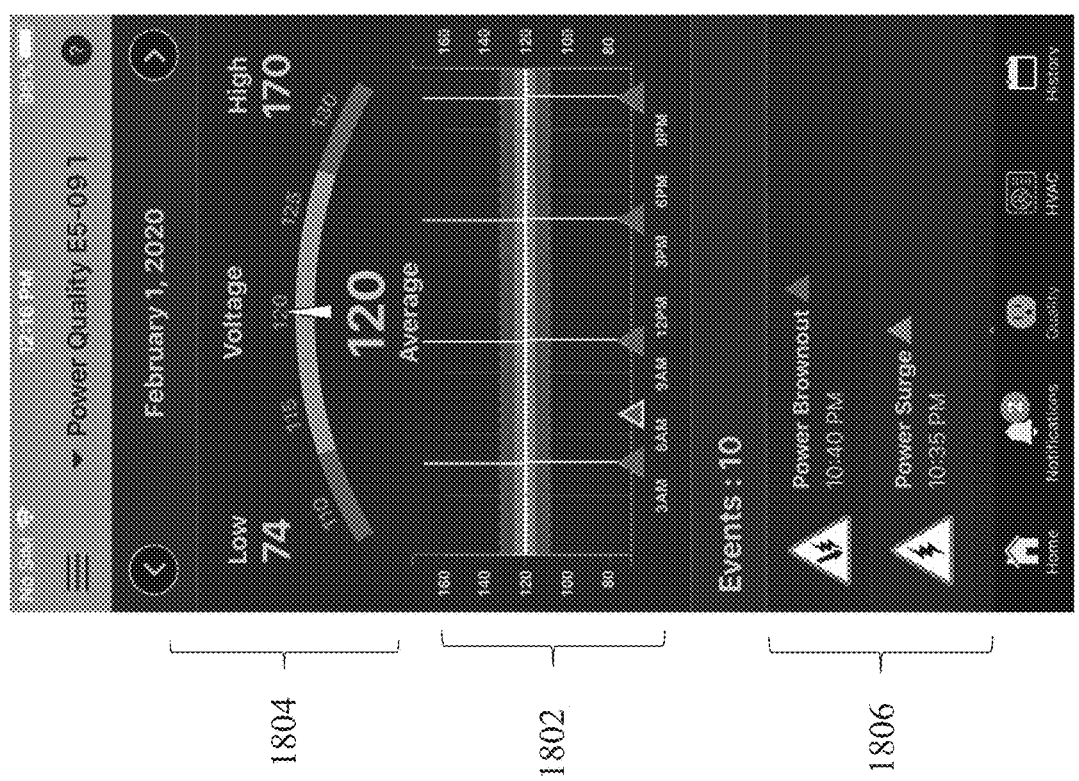
FIG. 18 is a diagram of a user interface displayed on a remote computing device that shows historical Voltage RMS readings detected by an outage detection device.
Figure 19:
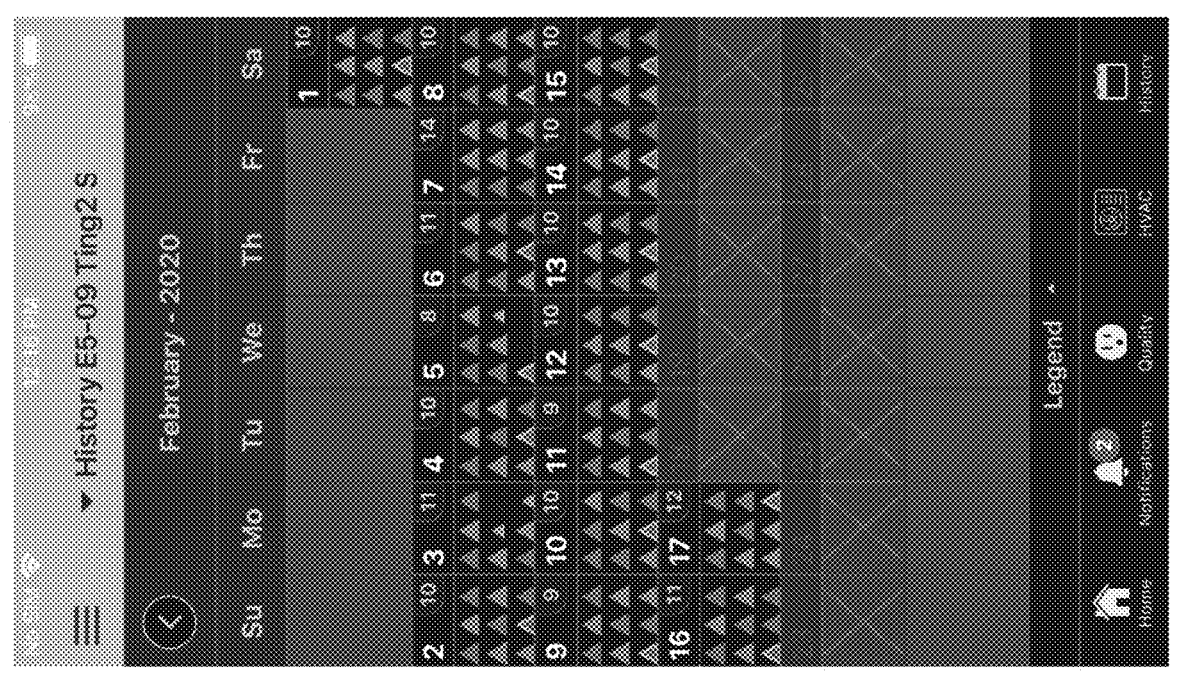

As mentioned above, the server computing device 106 and/or the outage detection device 102 can be configured to generate alert notifications, reports, maps, charts, and the like for display to users on related remote computing devices. FIG. 18 is a diagram of a user interface displayed on a remote computing device (e.g., a mobile phone) that shows historical RMS voltage (Vrms) readings captured by an outage detection device 102. As shown in FIG. 18, the graph 1802 shows the Vrms readings captured by the outage detection device 102 over the course of a single day, and the meter 1804 shows the low, high, and average Vrms readings. This user interface provides an easy-to-understand depiction of the power quality for a particular location. The user interface can also include a list 1806 of related power quality events—such as brownouts or power surges. For example, the user interface shows a power brownout occurred at 10:40 pm, designated by a yellow triangle on the graph 1802. The server computing device 106 can also generate a historical calendar view of the power quality events that occurred for a power outage detection device 102—as shown in FIG. 19, a user can view a month's worth of power quality events (e.g., brownouts, surges, outages) to get a comprehensive picture of the general power quality of the electrical network that services his or her home.

Figure 20B:
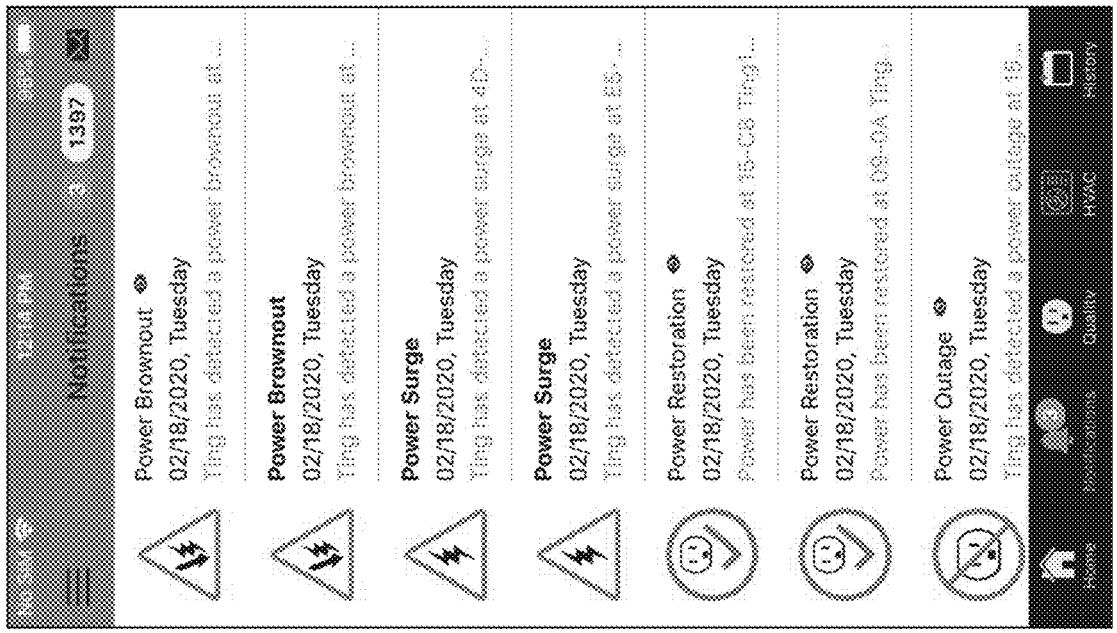
FIG. 20B is a diagram of a user interface that shows a list of power quality notifications relating to an outage detection device.
Figure 20A:
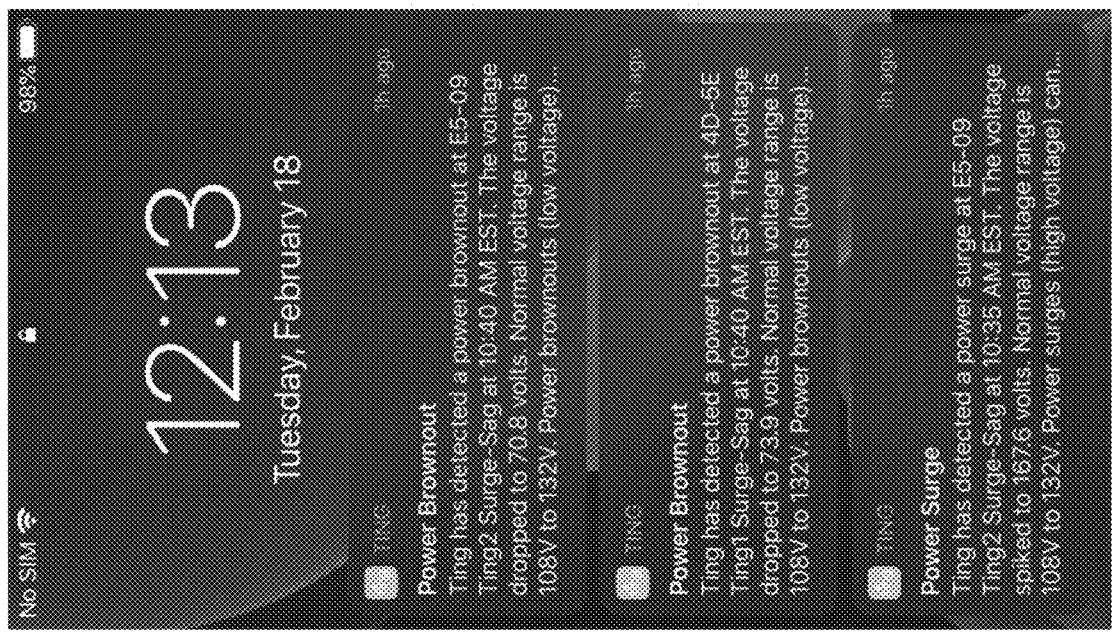
FIG. 20A is a diagram of a user interface that shows push notification alerts sent by the server computing device to a remote computing device for display.
Figure 20D:
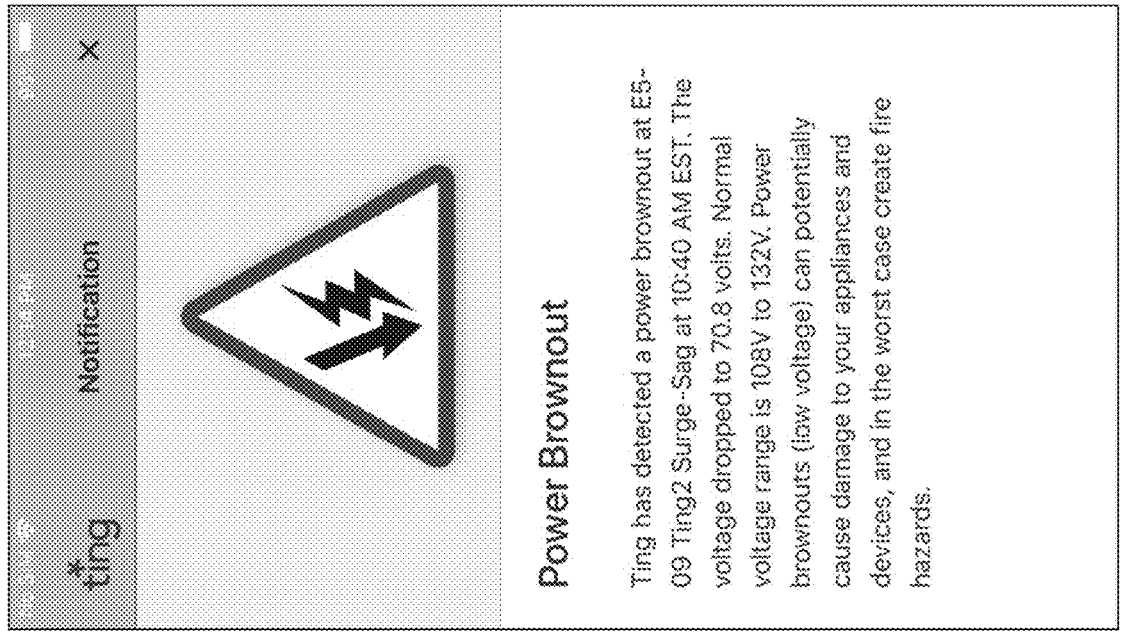
FIG. 20D is a diagram of a user interface that shows a detailed power brownout event alert notification sent by the server computing device to a remote computing device for display.
Figure 20C:
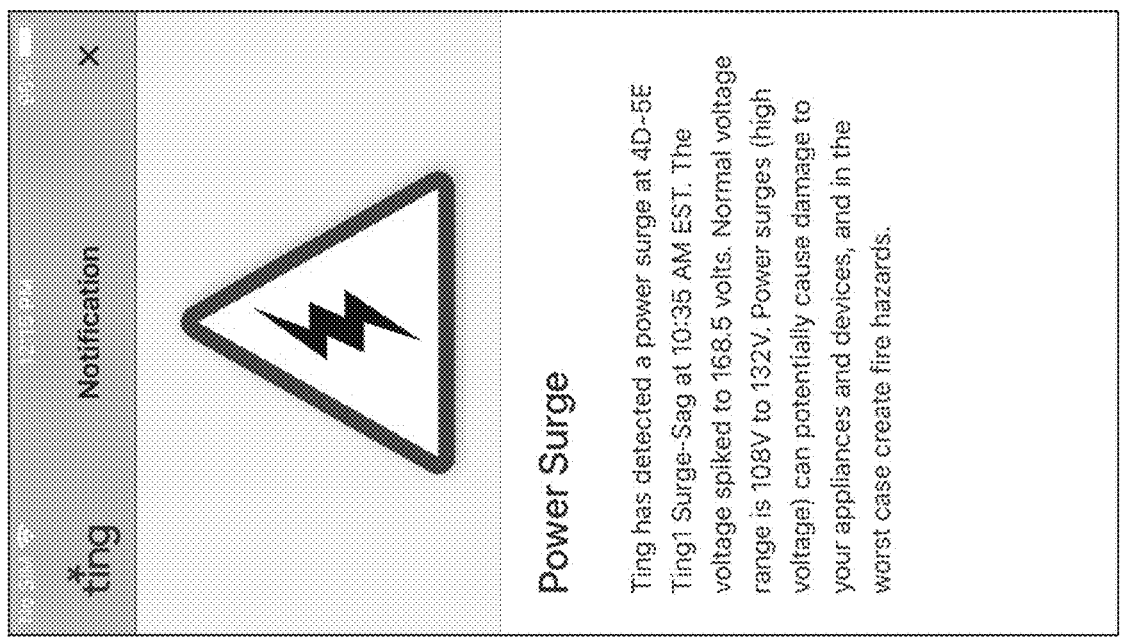
FIG. 20C is a diagram of a user interface that shows a detailed power surge event alert notification sent by the server computing device to a remote computing device for display.
Figure 20E:
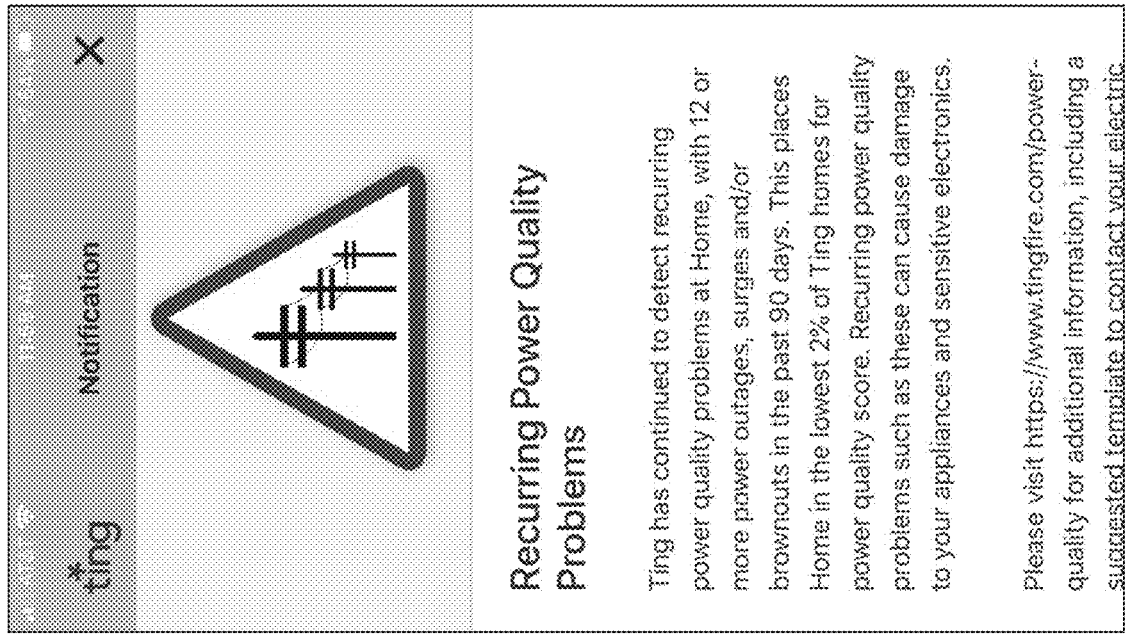
FIG. 20E is a diagram of a user interface that shows a recurring power quality problems alert notification sent by the server computing device to a remote computing device for display.

In conjunction with the power quality reports and graphs described above, the server computing device 106 can also generate and transmit power quality notifications to one or more remote computing devices. FIG. 20A is a diagram of a user interface that shows push notification alerts sent by the server computing device 106 to a remote device for display. As shown in FIG. 20A, the push alerts comprise a description of the related power quality event along with a time that the event occurred. Similarly, FIG. 20B is a diagram of a user interface that shows a list of power quality notifications relating to an outage detection device. FIGS. 20C, 20D and 20E are detailed power quality event alert notifications displayed to users of remote computing devices. FIG. 20C is a power surge notification providing the user with detailed information regarding the timing, location (e.g., which outage detection device captured the data associated with the event), and voltage reading for the surge event. FIG. 20D is a power brownout notification providing the user with detailed information regarding the timing, location, and voltage reading for the brownout event. FIG. 20E is a recurring power quality problems notification providing the user with detailed information regarding the cadence and amount of power quality problems experienced by a home's electrical system. As a result, the system 100 is configured to automatically generate and transmit these alerts quickly to relevant users so that the users can stay up-to-date on power quality events that affect their home or business.

In addition to event notification messages, the systems and methods described herein can generate maps that display the location of particular power quality events in relation to each other and enables users (e.g., consumers, grid operators, utility companies) to quickly and easily determine whether a particular geographic area is experiencing a type of power quality event that needs to be resolved.

Figure 21A:
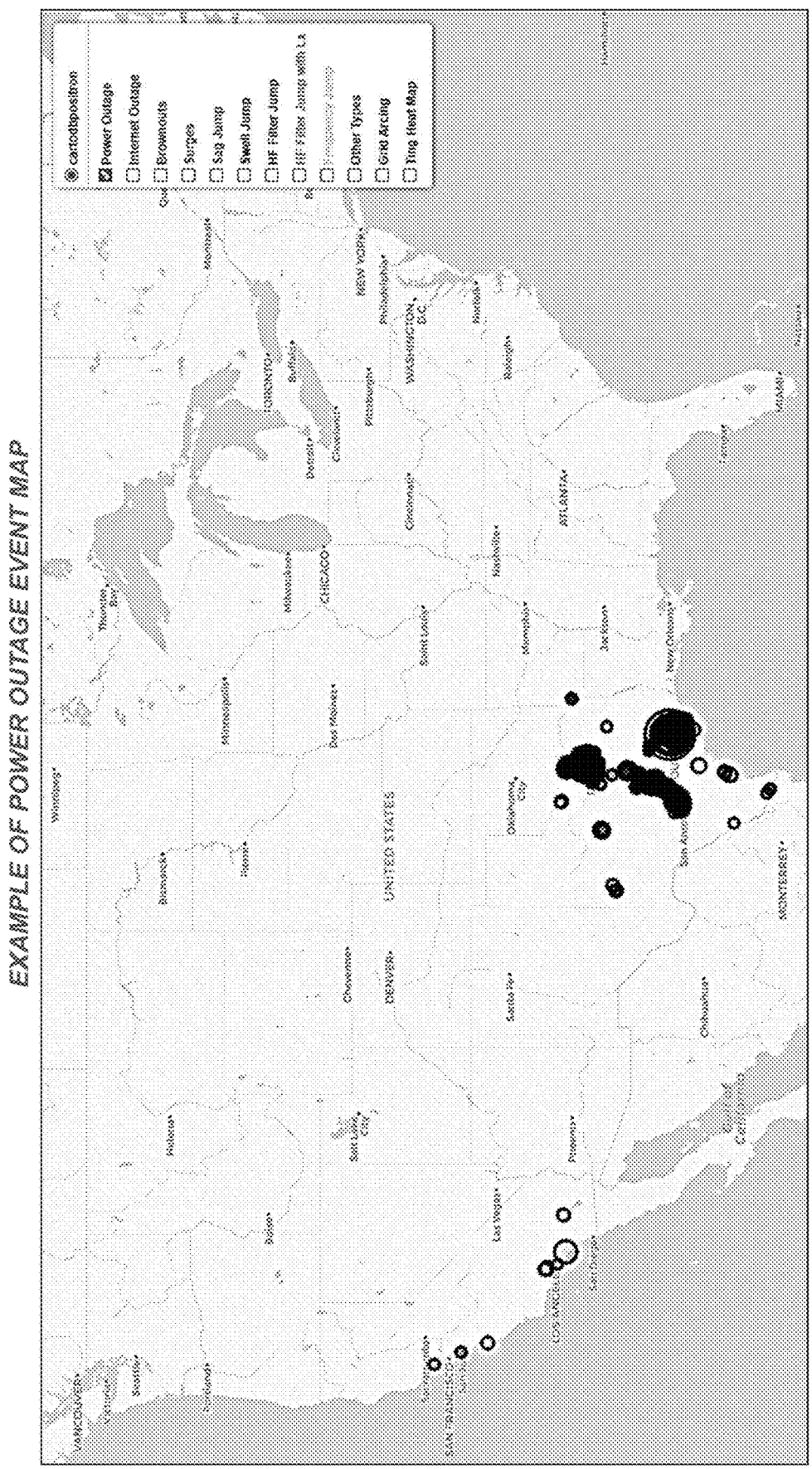
FIG. 21A is a diagram of a geographic map generated by the server computing device that depicts the location of detected power outage events by a network of outage detection devices.
Figure 21B:
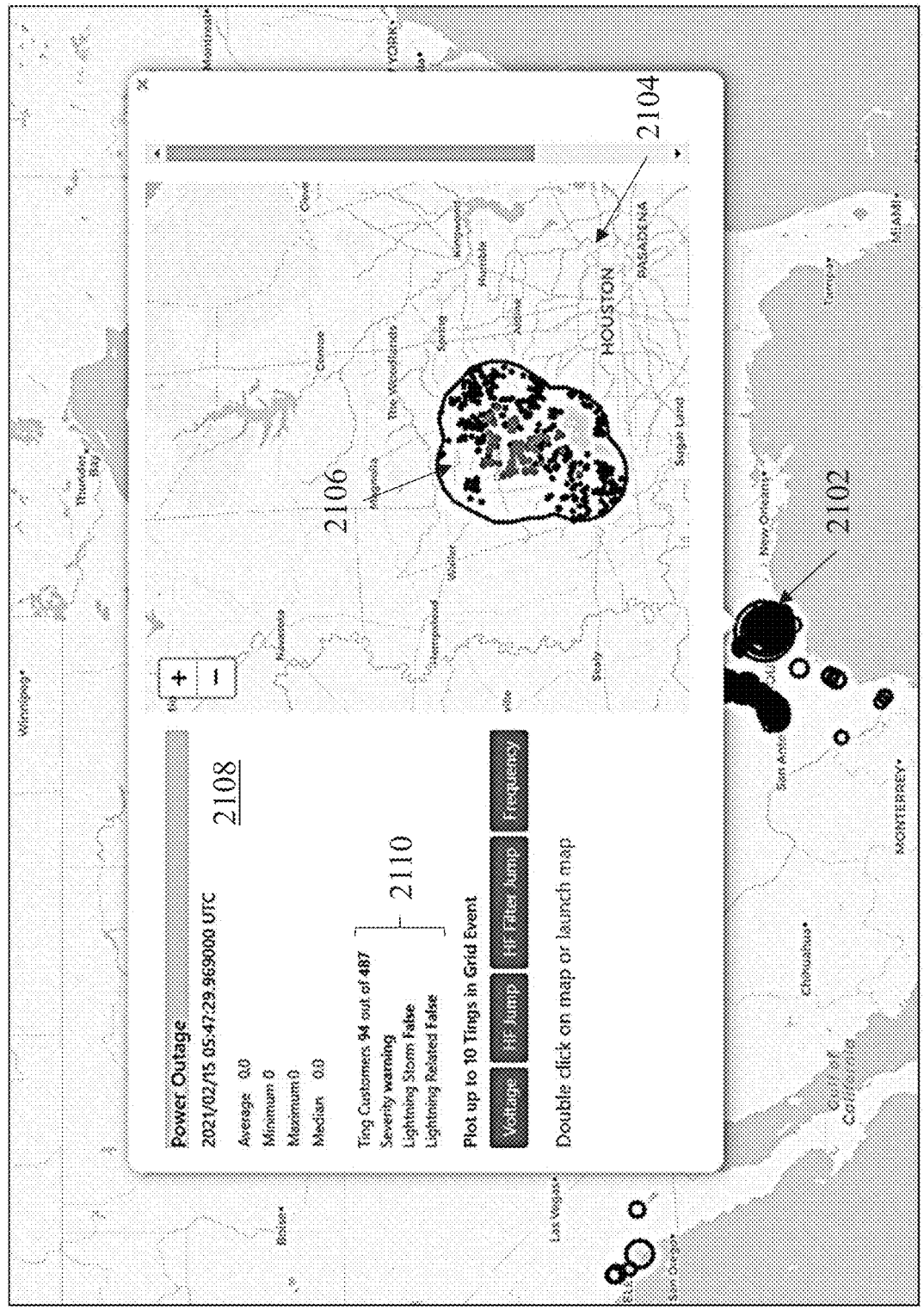
FIG. 21B is a diagram of a detail view of the geographic map generated by the server computing device that depicts the location of detected power outage events by a network of outage detection devices.

FIG. 21A is a diagram of a geographic map generated by the server computing device 106 that depicts the location of detected power outage events by the network of outage detection devices. As shown in FIG. 21A, each circle on the map represents one or more power outage events with bigger circles identifying more widespread outages. A user can interact with the map of FIG. 21A (e.g., by clicking on one of the circles) to see a more detailed view of a particular geographic area—as shown in FIG. 21B, where the user selected a power outage event 2102 in the greater Houston, Tex. area, and the server computing device 106 generates a zoomed-in view 2104 of the map including a plot 2106 of the specific outage detection device locations as well as an information area 2108 that includes details about the outage event, including number of customers affected, a summary of the readings captured by the outage detection devices, correlated events 2110 and other power quality data information.

Figure 22A:
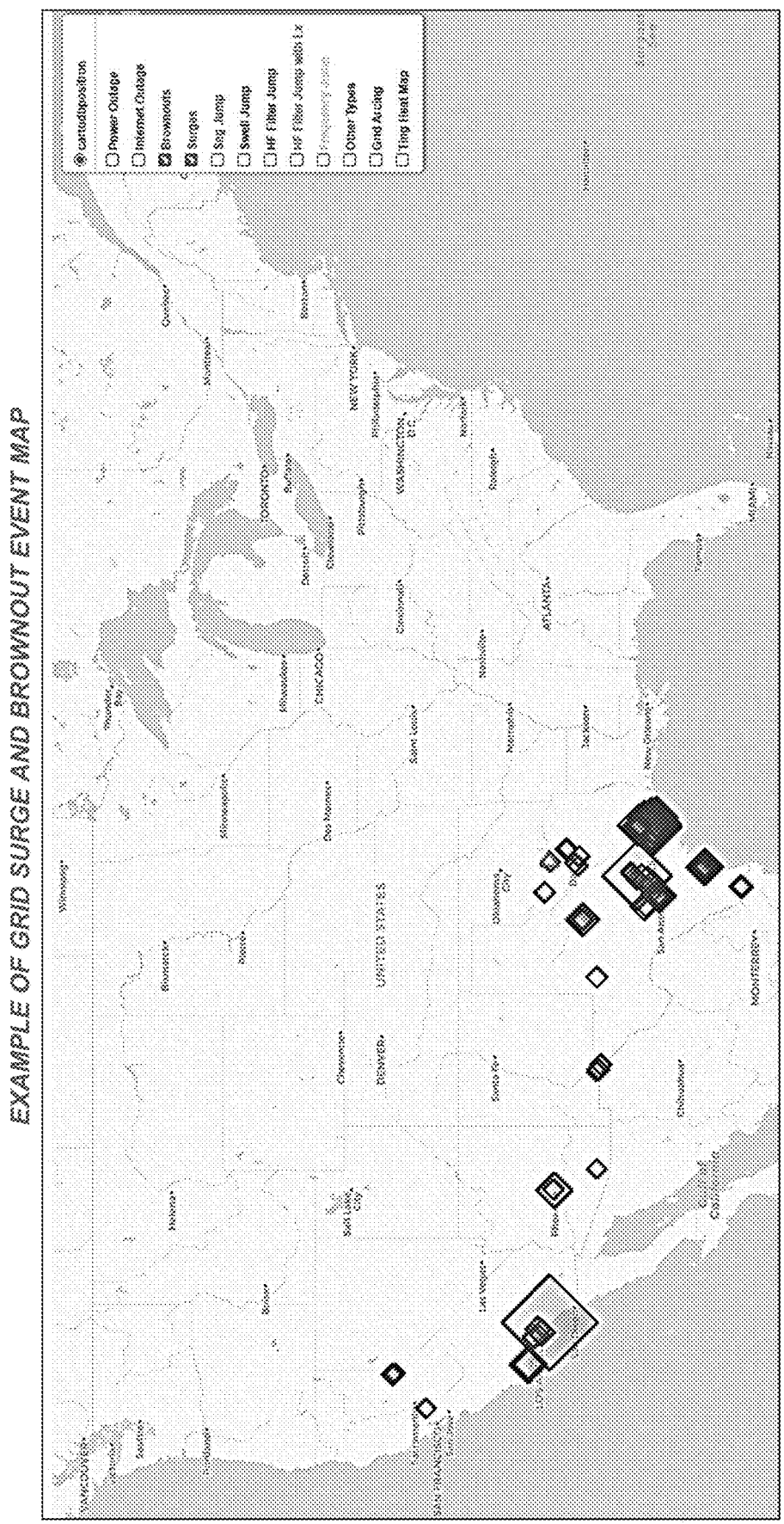
FIG. 22A is a diagram of a geographic map generated by the server computing device that depicts the location of detected grid surge and brownout events by a network of outage detection devices.
Figure 22B:
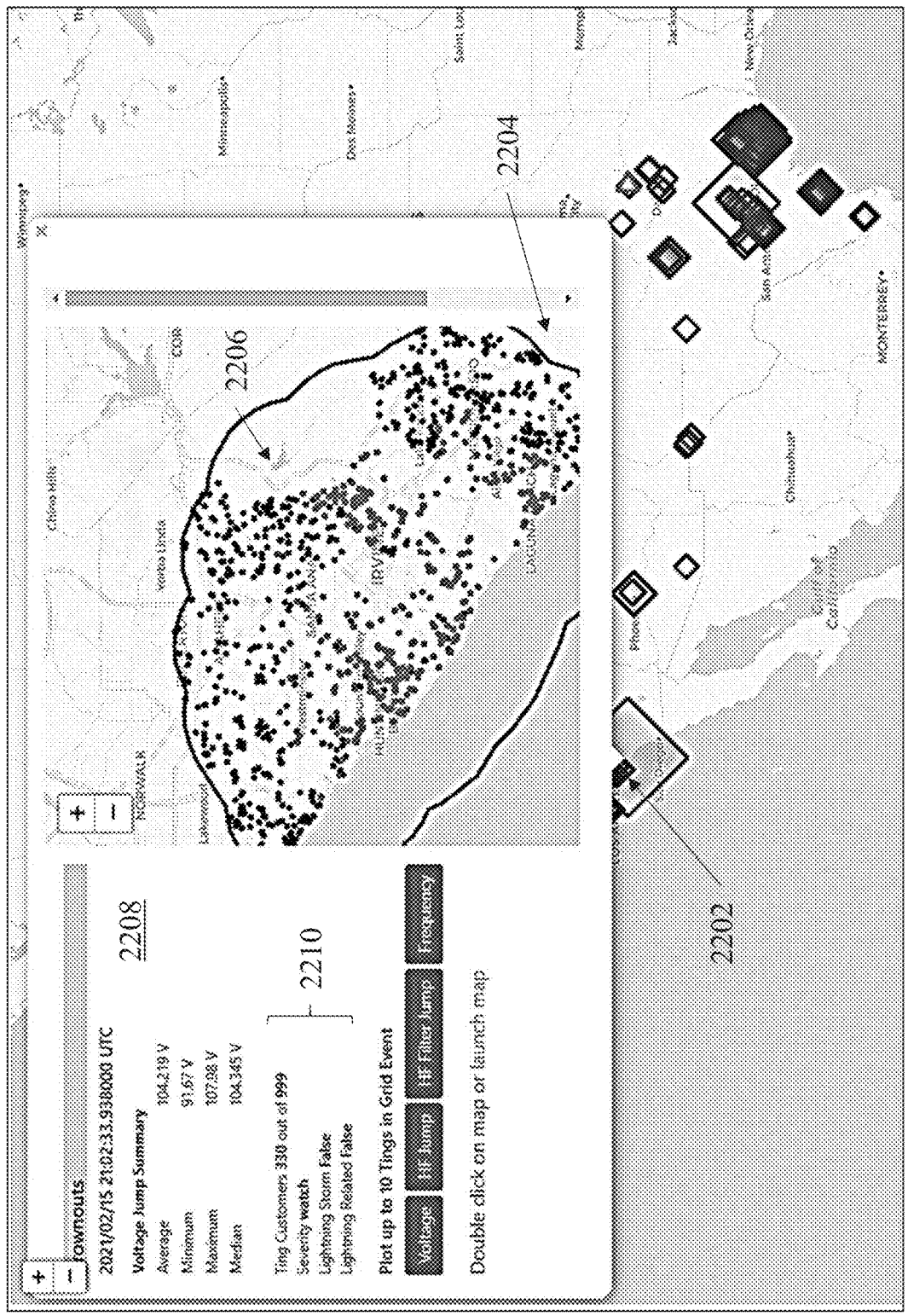
FIG. 22B is a diagram of a detail view of the geographic map generated by the server computing device that depicts the location of detected grid surge and brownout events by a network of outage detection devices.

FIG. 22A is a diagram of a geographic map generated by the server computing device 106 that depicts the location of detected grid surge and brownout events by the network of outage detection devices. As shown in FIG. 22A, each diamond on the map represents one or more grid surge and/or brownout events with bigger diamonds identifying more widespread events. A user can interact with the map of FIG. 22A (e.g., by clicking on one of the diamonds) to see a more detailed view of a particular geographic area—as shown in FIG. 22B, where the user selected a brownout event 2202 in the greater Los Angeles area, and the server computing device 106 generates a zoomed-in view 2204 of the map including a plot 2206 of the specific outage detection device locations as well as an information area 2208 that includes details about the brownout event, including the number of customers affected, a summary of the readings captured by the outage detection devices, correlated events 2210 and other power quality data information.

Figure 23:
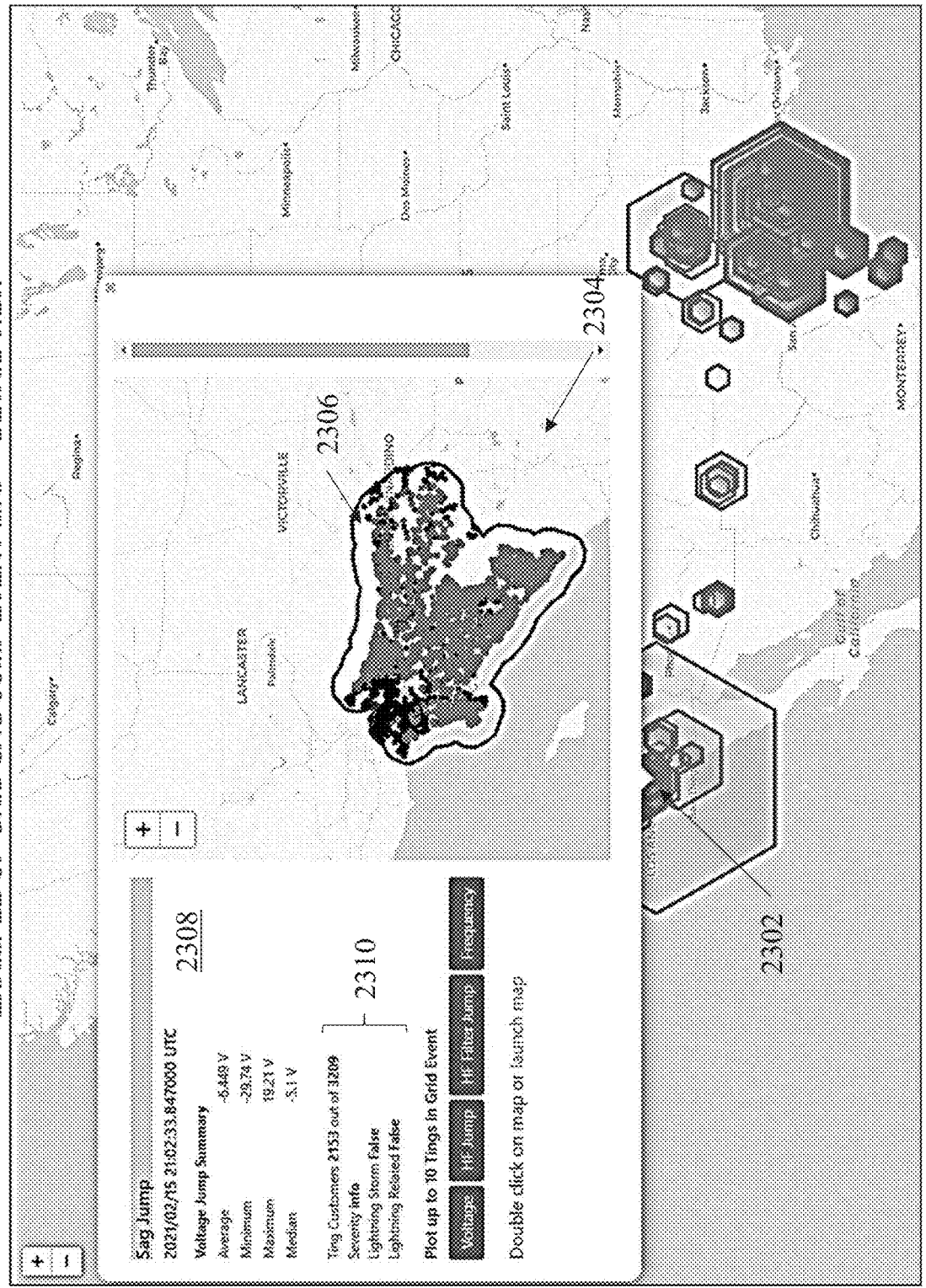
FIG. 23 is a diagram of a detail view of a geographic map generated by the server computing device that depicts the location of detected grid sag jump events by a network of outage detection devices.

Similarly, FIG. 23 is a diagram of detailed view of a map depicting grid sag jump events detected in a particular geographic area (i.e., Los Angeles). As shown in FIG. 23, the user selects a sag jump event 2302 near Los Angeles and the server computing device 106 generates a zoomed-in view 2304 of the map including a plot 2306 of the specific outage detection device locations as well as an information area 2308 that includes details about the grid sag jump event, including the number of customers affected, a summary of the readings captured by the outage detection devices, correlated events 2310 and other power quality data information.

Figure 24:
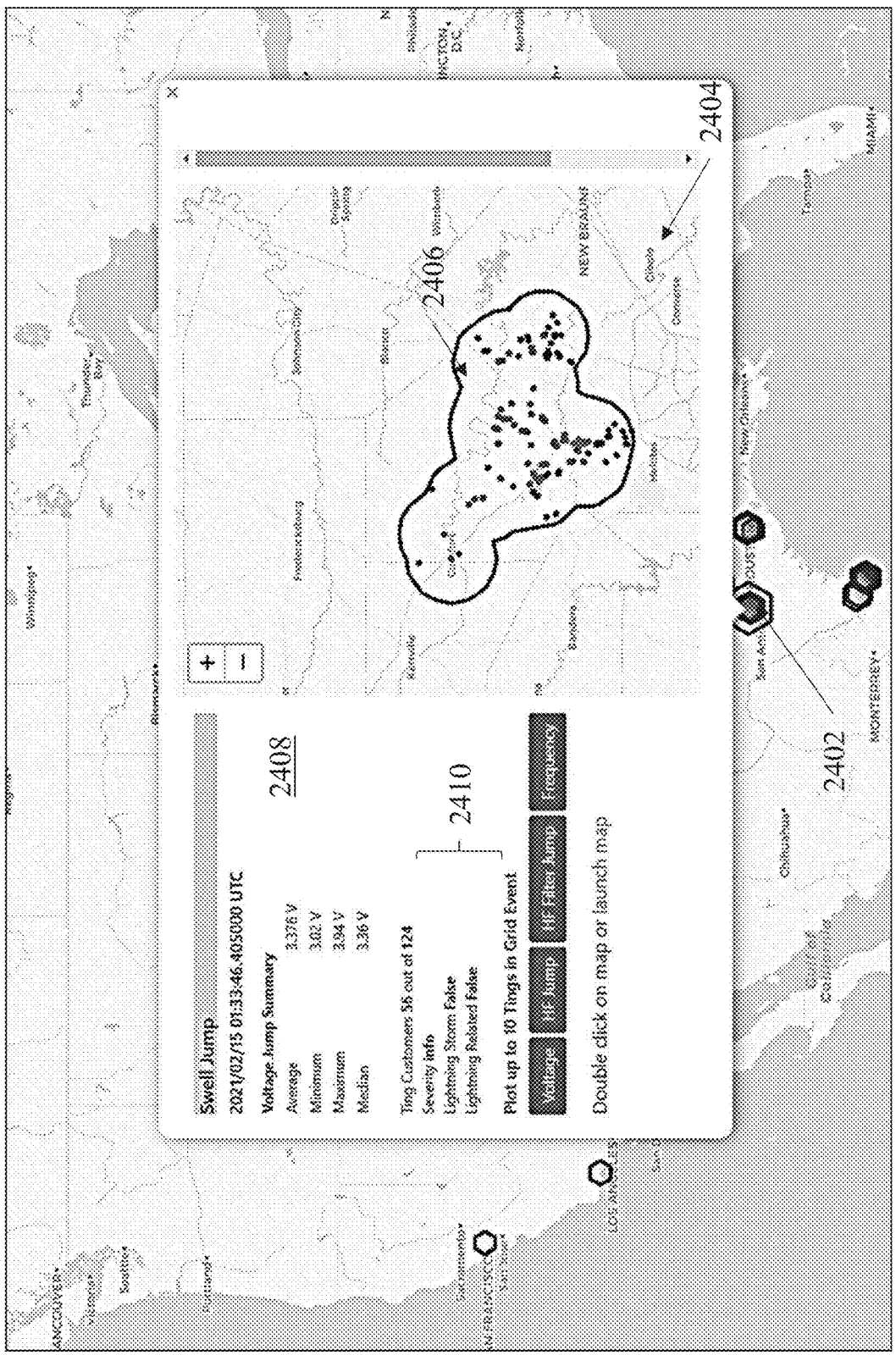
FIG. 24 is a diagram of a detail view of a geographic map generated by the server computing device that depicts the location of detected grid swell jump events by a network of outage detection devices.

FIG. 24 is a diagram of detailed view of a map depicting grid swell jump events detected in a particular geographic area (i.e., near San Antonio, Tex.). As shown in FIG. 24, the user selects a swell jump event 2402 near San Antonio and the server computing device 106 generates a zoomed-in view 2404 of the map including a plot 2406 of the specific outage detection device locations as well as an information area 2408 that includes details about the swell jump event, including the number of customers affected, a summary of the readings captured by the outage detection devices, correlated events 2410 and other power quality data information.

Figure 25A:
FIG. 25A is a diagram of a geographic map generated by the server computing device that depicts the location of detected grid frequency jump events by a network of outage detection devices.
Figure 25B:
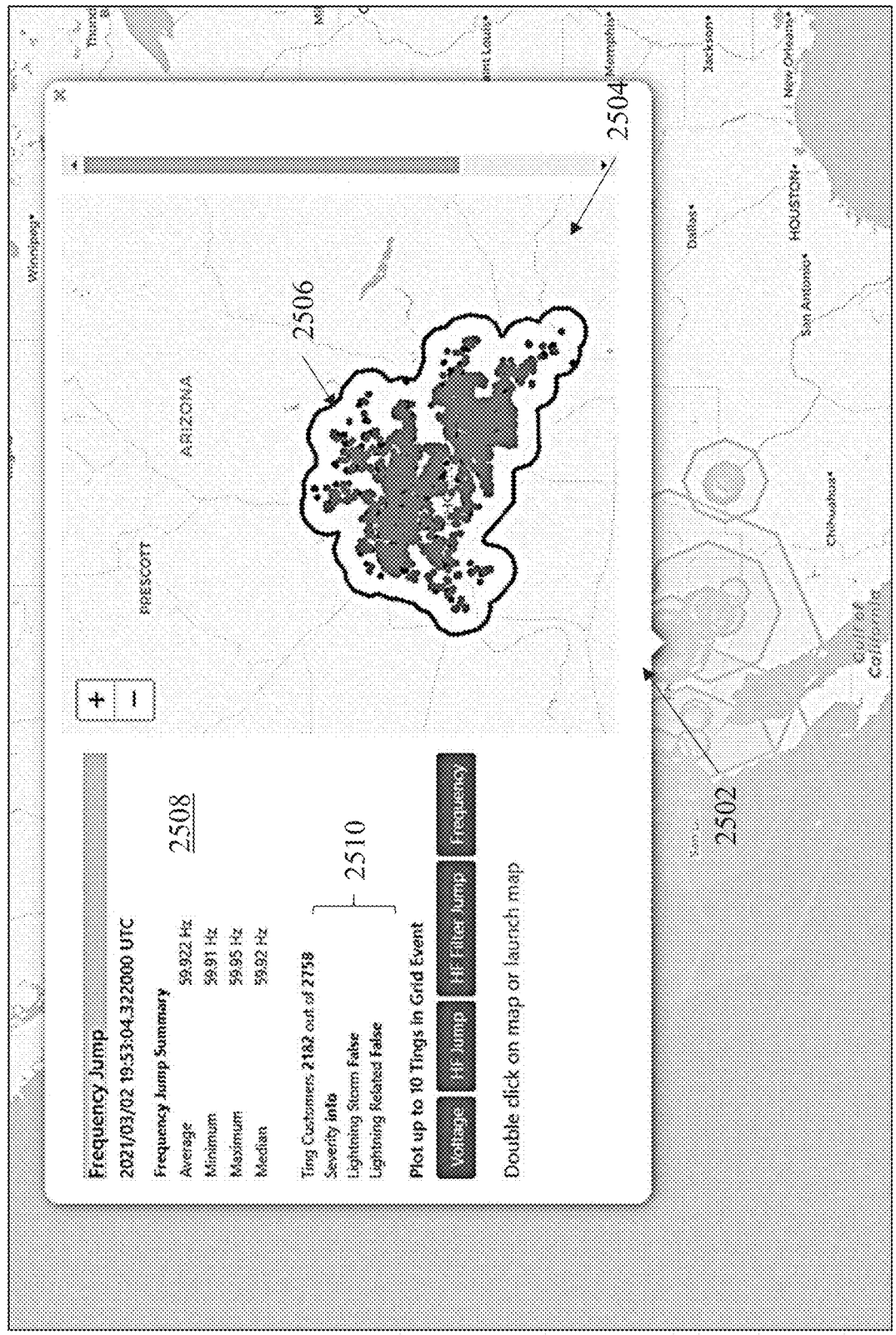
FIG. 25B is a diagram of a detail view of the geographic map generated by the server computing device that depicts the location of detected grid frequency jump events by a network of outage detection devices.

FIG. 25A is a diagram of a geographic map generated by the server computing device 106 that depicts the location of detected grid frequency events by the network of outage detection devices. As shown in FIG. 25A, each octagon on the map represents one or more grid frequency events with bigger octagons identifying more widespread events. Like the maps above, a user can interact with the map of FIG. 25A to see a more detailed view of a particular geographic area—as shown in FIG. 25B, where the user selected a frequency event 2502 in the greater Los Angeles area, and the server computing device 106 generates a zoomed-in view 2504 of the map including a plot 2506 of the specific outage detection device locations as well as an information area 2508 that includes details about the outage event, including the number of customers affected, a summary of the readings captured by the outage detection devices, correlated events 2510 and other power quality data information.

Figure 26:
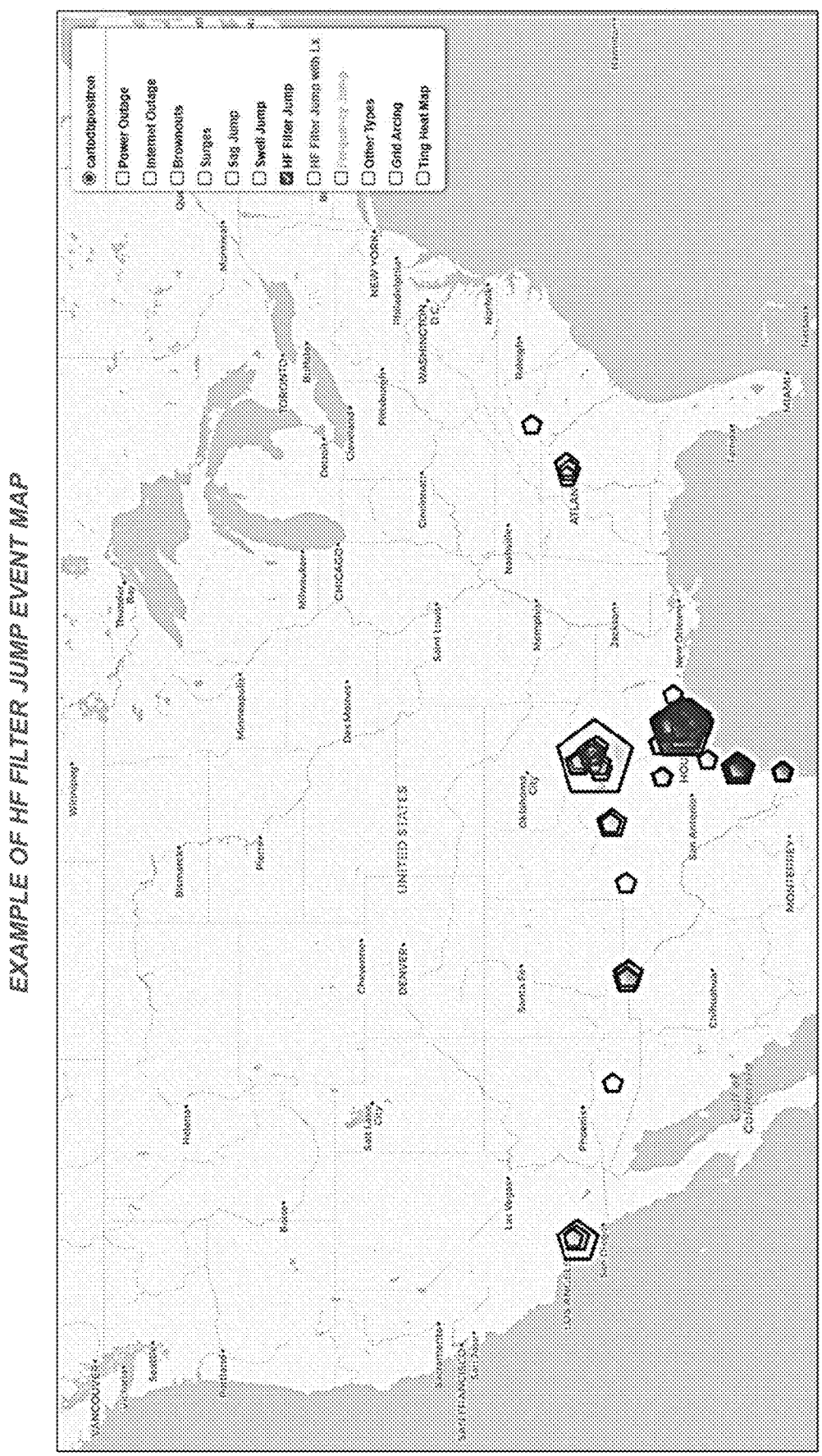
FIG. 26 is a diagram of a geographic map generated by the server computing device that depicts the location of detected high frequency (HF) filter jump events by a network of outage detection devices.

FIG. 26 is a diagram of a geographic map generated by the server computing device 106 that depicts the location of detected HF Filter jump events by the network of outage detection devices. As shown in FIG. 26, each pentagon on the map represents one or more grid frequency events with bigger pentagons identifying more widespread events. Like the maps above, a user can interact with the map of FIG. 26 to see a more detailed view of a particular geographic area.

It should be appreciated that the server computing device 106 can generate maps that comprise a plurality of different power outage and/or power quality events on the same geographic area. For example, in some embodiments a user can select multiple different events (e.g., in a checkbox menu) and the server computing device 106 can display each type of event using a different indicator, such as a different shape, color, etc.

The above-described techniques can be implemented in digital and/or analog electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more processors executing a computer program to perform functions of the technology by operating on input data and/or generating output data. Method steps can also be performed by, and an apparatus can be implemented as, special purpose logic circuitry, e.g., a FPGA (field programmable gate array), a FPAA (field-programmable analog array), a CPLD (complex programmable logic device), a PSoC (Programmable System-on-Chip), ASIP (application-specific instruction-set processor), or an ASIC (application-specific integrated circuit), or the like. Subroutines can refer to portions of the stored computer program and/or the processor, and/or the special circuitry that implement one or more functions.

Processors suitable for the execution of a computer program include, by way of example, both general and special purpose microprocessors, and any one or more processors of any kind of digital or analog computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. Generally, a computer also includes, or is operatively coupled to receive data from or transfer data to, or both, one or more mass storage devices for storing data, e.g., magnetic, magneto-optical disks, or optical disks. A computer can also be operatively coupled to a communications network in order to receive instructions and/or data from the network and/or to transfer instructions and/or data to the network. Computer-readable storage mediums suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

To provide for interaction with a user, the above described techniques can be implemented on a computer in communication with a display device, e.g., a CRT (cathode ray tube), plasma, or LCD (liquid crystal display) monitor, for displaying information to the user and a keyboard and a pointing device, e.g., a mouse, a trackball, a touchpad, or a motion sensor, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributed computing system that includes a front-end component. The front-end component can, for example, be a client computer having a graphical user interface, a Web browser through which a user can interact with an example implementation, and/or other graphical user interfaces for a transmitting device. The above described techniques can be implemented in a distributed computing system that includes any combination of such back-end, middleware, or front-end components.

The components of the computing system can be interconnected by transmission medium, which can include any form or medium of digital or analog data communication (e.g., a communication network). Transmission medium can include one or more packet-based networks and/or one or more circuit-based networks in any configuration. Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), Bluetooth, Wi-Fi, WiMAX, general packet radio service (GPRS) network, HiperLAN), and/or other packet-based networks. Circuit-based networks can include, for example, the public switched telephone network (PSTN), a legacy private branch exchange (PBX), a wireless network (e.g., RAN, code-division multiple access (CDMA) network, time division multiple access (TDMA) network, global system for mobile communications (GSM) network), and/or other circuit-based networks.

Information transfer over transmission medium can be based on one or more communication protocols. Communication protocols can include, for example, Ethernet protocol, Internet Protocol (IP), Voice over IP (VOIP), a Peer-to-Peer (P2P) protocol, Hypertext Transfer Protocol (HTTP), Session Initiation Protocol (SIP), H.323, Media Gateway Control Protocol (MGCP), Signaling System #7 (SS7), a Global System for Mobile Communications (GSM) protocol, a Push-to-Talk (PTT) protocol, a PTT over Cellular (POC) protocol, and/or other communication protocols.

Devices of the computing system can include, for example, a computer, a computer with a browser device, a telephone, an IP phone, a mobile device (e.g., cellular phone, smartphone, personal digital assistant (PDA) device, laptop computer, electronic mail device), and/or other communication devices. The browser device includes, for example, a computer (e.g., desktop computer, laptop computer) with a World Wide Web browser (e.g., Microsoft® Internet Explorer® available from Microsoft Corporation, Mozilla® Firefox available from Mozilla Corporation). Mobile computing devices include, for example, iOS™-based devices such as the iPhone™ and iPad™ available from Apple, Inc., and Android™-based devices such as the Galaxy™ available from Samsung Corp., the Pixel™ available from Google, Inc., and the Kindle Fire™ available from Amazon, Inc.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein.

What is claimed is:

1. A system for detection and notification of electrical power outages, the system comprising:
   a sensor device coupled to a circuit, the sensor device configured to
      periodically transmit a keepalive packet to a server computing device;
      detect an input signal generated by electrical activity on the circuit;
      generate an output signal based upon the detected input signal;
      monitor the generated output signal during each of a plurality of clock cycles having a predefined duration;
      during each clock cycle:
         determine whether a rising edge occurred in the generated output signal;
         transmit a fault packet to the server computing device when the rising edge occurred prior to a predetermined clock value in the clock cycle or when no rising edge occurred in the clock cycle; and
         initiate a new clock cycle;
   a server computing device communicably coupled to the sensor device, the server computing device configured to:
      receive the fault packet from the sensor device;
      listen for one or more keepalive packets from the sensor device;
      transmit a power outage notification to one or more remote computing devices when no keepalive packets are received from the sensor device for at least a defined time period after the fault packet is received; and
      transmit a power restoration notification to the one or more remote computing devices when one or more keepalive packets are subsequently received from the sensor device after the power outage notification is transmitted.

2. The system of claim 1, wherein the input signal comprises an alternating current (AC) voltage sine wave with a plurality of zero crossings.

3. The system of claim 2, wherein the output signal is a voltage curve having a plurality of rising edges corresponding to the zero crossings of the input signal.

4. The system of claim 2, wherein the keepalive packet comprises power quality data including one or more of: root mean square (RMS) voltage, frequency of the voltage sine wave, relative phase angle of the voltage sine wave, amplitude of the voltage sine wave harmonics, or any number of measures of high frequency noise amplitude.

5. The system of claim 1, wherein each clock cycle has a predefined duration of 9 milliseconds.

6. The system of claim 5, wherein the predetermined clock value in the clock cycle is 8.33 milliseconds.

7. A computerized method of detection and notification of electrical power outages, the method comprising:
   periodically transmitting, by a sensor device coupled to a circuit, a keepalive packet to a server computing device;
   detecting, by the sensor device, an input signal generated by electrical activity on the circuit;
   generating, by the sensor device, an output signal based upon the detected input signal;
   monitoring, by the sensor device, the generated output signal during each of a plurality of clock cycles having a predefined duration;
   during each clock cycle:
      determining, by the sensor device, whether a rising edge occurred in the generated output signal;
      transmitting, by the sensor device, a fault packet to the server computing device when the rising edge occurred prior to a predetermined clock value in the clock cycle or when no rising edge occurred in the clock cycle;
   initiating, by the sensor device, a new clock cycle;
   receiving, by the server computing device, the fault packet from the sensor device;
   listening for, by the server computing device, one or more keepalive packets from the sensor device;
   transmitting, by the server computing device, a power outage notification to one or more remote computing devices when no keepalive packets are received from the sensor device for at least a defined time period after the fault packet is received; and transmitting, by the server computing device, a power restoration notification to the one or more remote computing devices when one or more keepalive packets are subsequently received from the sensor device after the power outage notification is transmitted.

8. The method of claim 7, wherein the input signal comprises an alternating current (AC) voltage sine wave with a plurality of zero crossings.

9. The method of claim 8, wherein the output signal is a voltage curve having a plurality of rising edges corresponding to the zero crossings of the input signal.

10. The method of claim 8, wherein the keepalive packet comprises power quality data including one or more of: root mean square (RMS) voltage, frequency of the voltage sine wave, relative phase angle of the voltage sine wave, amplitude of the voltage sine wave harmonics, or any number of measures of high frequency noise amplitude.

11. The method of claim 7, wherein each clock cycle has a predefined duration of 9 milliseconds.

12. The method of claim 11, wherein the predetermined clock value in the clock cycle is 8.33 milliseconds.

13. A system for detection and notification of electrical power quality, the system comprising:
one or more sensor devices each coupled to a circuit, each sensor device configured to
  detect an input signal generated by electrical activity on the circuit;
  generate an output signal based upon the detected input signal; and
  transmit power quality data to a server computing device, the power quality data based upon the output signal;
the server computing device configured to
  receive the power quality data from the one or more sensor devices;
  analyze the power quality data in conjunction with historical power quality data received from the one or more sensor devices to detect one or more power quality events;
  and
  transmit a power quality notification to one or more remote computing devices based upon the detected power quality events.

14. The system of claim 13, wherein the detected one or more power quality events comprise one or more of: surge events, surge jump events, sag events, sag jump events, brownout events, swell jump events, high frequency (HF) filter jump events, frequency jump events, recurring power quality problems, phase angle jump events, loose neutral events, or generator activation events.

15. The system of claim 14, wherein the server computing device is further configured to correlate (i) the detected one or more power quality events with zero or more external events and/or (ii) a detected power quality event from a first sensor device with a detected power quality event from one or more other sensor devices.

16. The system of claim 15, wherein the server computing device detects a loose neutral event by:
analyzing, for a single sensor device, a number and amplitude of surge events, surge jump events, and sag events recorded by the single sensor device within a predetermined time period which do not correlate with matching power quality events from any other sensor devices in proximity to the single sensor device; and
generating a loose neutral event when an average number of the surge events is greater than a first defined number per day, or an average number of the surge jump events having a magnitude greater than a defined percentage of a nominal voltage is greater than a second defined number per day, or an average number of the sag events is greater than a third defined number per day.

17. The system of claim 15, wherein the output signal comprises one or more of: root mean square (RMS) voltage, frequency of the voltage sine wave, relative phase angle of the voltage sine wave, amplitude of the voltage sine wave harmonics, or any number of measures of high frequency noise amplitude.

18. The system of claim 17, wherein the server computing device detects a surge event by:
analyzing a plurality of sequential data points of RMS voltage from one or more sensor devices; and
generating a surge event when the RMS voltage is greater than a predefined threshold percentage of a nominal voltage for a number of consecutive data points.

19. The system of claim 18, wherein the predefined threshold percentage varies based upon the number of consecutive data points in which the RMS voltage is greater than a minimum threshold percentage.

20. The system of claim 15, wherein the server computing device detects a brownout event by:
analyzing a plurality of sequential data points of RMS voltage from one or more sensor devices; and
generating a brownout event when the RMS voltage is less than a predefined threshold percentage of a nominal voltage for a number of consecutive data points.

21. The system of claim 20, wherein the predefined threshold percentage varies based upon the number of consecutive data points in which the RMS voltage is less than a minimum threshold percentage.

22. The system of claim 15, wherein the server computing device detects a sag jump event by:
analyzing a plurality of sequential data points of RMS voltage from one or more sensor devices; and
generating a sag jump event for each of one or more drops of RMS voltage that occurred in the plurality of sequential data points and that are larger than a predefined threshold percentage of a nominal voltage.

23. The system of claim 15, wherein the server computing device detects a swell jump event by:
analyzing a plurality of sequential data points of RMS voltage from one or more sensor devices; and
generating a swell jump event for each of one or more increases of RMS voltage that occurred in the plurality of sequential data points and that are larger than a predefined threshold percentage of a nominal voltage.

24. The system of claim 15, wherein the server computing device detects a HF Filter jump event by:
analyzing a plurality of sequential data points of HF amplitude data from one or more sensor devices;
calculating a mean of the HF amplitude data; and
when the mean is greater than one, generating an HF Filter jump event when the HF amplitude data increases by more than a threshold multiple of the mean, or
when the mean is less than one, generating an HF Filter jump event when the HF amplitude data increases above a predefined threshold.

25. The system of claim 15, wherein the server computing device detects a frequency jump event by:
- analyzing a plurality of sequential data points of frequency data from one or more sensor devices;
- calculating an average of the frequency data;
- calculating a standard deviation of the frequency data; and
- generating a frequency jump event when the frequency increases by more than a predefined threshold from the average, or
- generating a frequency jump event when (i) the standard deviation changes from less than a first frequency to greater than a second frequency or (ii) the standard deviation changes from greater than the second frequency to less than the first frequency.

26. The system of claim 15, wherein the server computing device detects a generator activation event by:
- analyzing, for a single sensor device, whether any power outage events and frequency events were detected by the single sensor device during a predetermined time period; and
- generating a generator activation event when the single sensor device detected a power outage event followed by a frequency standard deviation change to greater than a predefined threshold within a predefined period of time of the power outage event and the frequency standard deviation change was not associated with a correlated external event.

27. The system of claim 15, wherein the one or more external events comprise lightning activity events, electrical grid monitoring events, and energy pricing events.

28. The system of claim 15, wherein the detected power quality event from the first sensor device and the detected power quality event from one or more other sensor devices are of a same event type.

29. A computerized method of detection and notification of electrical power quality, the system comprising:
- detecting, by a sensor device coupled to a circuit, an input signal generated by electrical activity on the circuit;
- generating, by the sensor device, an output signal based upon the detected input signal;
- transmitting, by the sensor device, power quality data to a server computing device, the power quality data based upon the output signal;
- receiving, by the server computing device, the power quality data from the sensor device;
- analyzing, by the server computing device, the power quality data in conjunction with historical power quality data received from the sensor device to detect one or more power quality events; and
- transmitting, by the server computing device, a power quality notification to one or more remote computing devices based upon the detected power quality events.

30. The method of claim 29, wherein the detected one or more power quality events comprise one or more of: surge events, surge jump events, sag events, sag jump events, brownout events, swell jump events, high frequency (HF) filter jump events, frequency jump events, recurring power quality problems, phase angle jump events, loose neutral events, or generator activation events.

31. The method of claim 30, wherein the server computing device further correlates (i) the detected one or more power quality events with zero or more external events and/or (ii) a detected power quality event from a first sensor device with a detected power quality event from one or more other sensor devices.

32. The method of claim 31, wherein the server computing device detects a loose neutral event by:
- analyzing, for a single sensor device, a number and amplitude of surge events, surge jump events, and sag events recorded by the single sensor device within a predetermined time period which do not correlate with matching power quality events from any other sensor devices in proximity to the single sensor device; and
- generating a loose neutral event when an average number of the surge events is greater than a first defined number per day, or an average number of the surge jump events having a magnitude greater than a defined percentage of a nominal voltage is greater than a second defined number per day, or an average number of the sag events is greater than a third defined number per day.

33. The method of claim 31, wherein the output signal comprises one or more of: root mean square (RMS) voltage, frequency of the voltage sine wave, relative phase angle of the voltage sine wave, amplitude of the voltage sine wave harmonics, or any number of measures of high frequency noise amplitude.

34. The method of claim 33, wherein the server computing device detects a surge event by:
- analyzing a plurality of sequential data points of RMS voltage from one or more sensor devices; and
- generating a surge event when the RMS voltage is greater than a predefined threshold percentage of a nominal voltage for a number of consecutive data points.

35. The method of claim 34, wherein the predefined threshold percentage varies based upon the number of consecutive data points in which the RMS voltage is greater than a minimum threshold percentage.

36. The method of claim 33, wherein the server computing device detects a brownout event by:
- analyzing a plurality of sequential data points of RMS voltage from one or more sensor devices; and
- generating a brownout event when the RMS voltage is less than a predefined threshold percentage of a nominal voltage for a number of consecutive data points.

37. The method of claim 36, wherein the predefined threshold percentage varies based upon the number of consecutive data points in which the RMS voltage is less than a minimum threshold percentage.

38. The method of claim 33, wherein the server computing device detects a sag jump event by:
- analyzing a plurality of sequential data points of RMS voltage from one or more sensor devices; and
- generating a sag jump event for each of one or more drops of RMS voltage that occurred in the plurality of sequential data points and that are larger than a predefined threshold percentage of a nominal voltage.

39. The method of claim 33, wherein the server computing device detects a swell jump event by:
- analyzing a plurality of sequential data points of RMS voltage from one or more sensor devices; and
- generating a swell jump event for each of one or more increases of RMS voltage that occurred in the plurality of sequential data points and that are larger than a predefined threshold percentage of a nominal voltage.

40. The method of claim 33, wherein the server computing device detects a HF Filter jump event by:
- analyzing a plurality of sequential data points of HF amplitude data from one or more sensor devices;
- calculating a mean of the HF amplitude data; and
- when the mean is greater than one, generating an HF Filter jump event when the HF amplitude data increases by more than a threshold multiple of the mean, or
- when the mean is less than one, generating an HF Filter jump event when the HF amplitude data increases above a predefined threshold.

41. The method of claim 33, wherein the server computing device detects a frequency jump event by:
- analyzing a plurality of sequential data points of frequency data from one or more sensor devices;
- calculating an average of the frequency data;
- calculating a standard deviation of the frequency data; and
- generating a frequency jump event when the frequency increases by more than a predefined threshold from the average, or
- generating a frequency jump event when (i) the standard deviation changes from less than a first frequency to greater than a second frequency or (ii) the standard deviation changes from greater than the second frequency to less than the first frequency.

42. The method of claim 33, wherein the server computing device detects a generator activation event by:
- analyzing, for a single sensor device, whether any power outage events and frequency events were detected by the single sensor device during a predetermined time period; and
- generating a generator activation event when the single sensor device detected a power outage event followed by a frequency standard deviation change to greater than a predefined threshold within a predefined period of time of the power outage event and the frequency standard deviation change was not associated with a correlated external event.

43. The method of claim 33, wherein the one or more external events comprise lightning activity events, electrical grid monitoring events, and energy pricing events.

44. The method of claim 33, wherein the detected power quality event from the first sensor device and the detected power quality event from one or more other sensor devices are of a same event type.

\* \* \* \* \*